US012660297B2

(12) United States Patent
Kim et al.

(10) Patent No.: US 12,660,297 B2
(45) Date of Patent: Jun. 16, 2026

(54) METHOD FOR FABRICATING A SEMICONDUCTOR DEVICE

(71) Applicant: SAMSUNG ELECTRONICS CO., LTD., Suwon-si (KR)

(72) Inventors: Ju Youn Kim, Suwon-si (KR); Myung Soo Seo, Suwon-si (KR); Joong Gun Oh, Suwon-si (KR); Seul Gi Yun, Suwon-si (KR); Jin Woo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 391 days.

(21) Appl. No.: 18/388,348

(22) Filed: Nov. 9, 2023

(65) Prior Publication Data

US 2024/0332090 A1 Oct. 3, 2024

(30) Foreign Application Priority Data

Mar. 31, 2023 (KR) ........................ 10-2023-0042458

(51) Int. Cl.
| | |
|---|---|
| *H10D 84/03* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/85* | (2025.01) |

(52) U.S. Cl.
CPC ......... *H10D 84/038* (2025.01); *H10D 30/014* (2025.01); *H10D 30/6735* (2025.01); *H10D 62/121* (2025.01); *H10D 64/017* (2025.01); *H10D 84/0167* (2025.01); *H10D 84/0179* (2025.01); *H10D 84/0181* (2025.01); *H10D 84/0184* (2025.01); *H10D 84/85* (2025.01)

(58) Field of Classification Search
CPC ...................................................... H10D 4/018
See application file for complete search history.

(56) References Cited

U.S. PATENT DOCUMENTS

| | | | |
|---|---|---|---|
| 9,553,092 | B2 | 1/2017 | Bao et al. |
| 9,680,023 | B1 | 6/2017 | Bao |
| 10,756,194 | B2 | 8/2020 | Bao et al. |
| 10,804,379 | B2 | 10/2020 | Zang et al. |
| 10,872,826 | B2 * | 12/2020 | Wu ...................... H10D 84/038 |
| 10,978,570 | B2 * | 4/2021 | Kim ................... H10D 64/667 |
| 11,031,301 | B2 | 6/2021 | Bao et al. |

(Continued)

*Primary Examiner* — Mounir S Amer
(74) *Attorney, Agent, or Firm* — MORGAN, LEWIS & BOCKIUS LLP

(57) ABSTRACT

A method for fabricating a semiconductor device includes providing a substrate having first to fourth regions defined thereon. First to fourth active patterns are formed in the first to fourth regions, respectively. Each of the first to fourth active patterns extends in a first horizontal direction. A gate insulating layer is formed on each of the first to fourth active patterns. A first gate electrode is formed in the first region and includes first and fifth layers, a second gate electrode is formed in the second region and includes first, second and fifth layers, a third gate electrode is formed in the third region and includes first, third, fourth and fifth layers and a fourth gate electrode is formed in the fourth region and includes first, second, third, fourth and fifth layers.

20 Claims, 29 Drawing Sheets

(56)                  References Cited

U.S. PATENT DOCUMENTS

| | | | |
|---|---|---|---|
| 11,189,616 B2 | 11/2021 | Bao et al. | |
| 11,380,793 B2 | 7/2022 | Lin et al. | |
| 11,443,982 B2 * | 9/2022 | Greene | H10D 64/017 |
| 2012/0129331 A1 * | 5/2012 | Choi | H01L 21/28088 |
| | | | 257/E21.19 |
| 2019/0198498 A1 * | 6/2019 | Park | H10D 30/6757 |
| 2022/0165624 A1 | 5/2022 | More et al. | |

* cited by examiner

METHOD FOR FABRICATING A SEMICONDUCTOR DEVICE

CROSS-REFERENCE TO RELATED APPLICATION

This application claims priority under 35 U.S.C. § 119 to Korean Patent Application No. 10-2023-0042458, filed on Mar. 31, 2023 in the Korean Intellectual Property Office, the disclosure of which is incorporated by reference in its entirety herein.

1. Technical Field

The present disclosure relates to a method for fabricating a semiconductor device.

2. Discussion of Related Art

The functions of semiconductor devices have increased along with the development of the information society. A high integration level of semiconductors is required to provide electronic products having a low cost and high quality. Semiconductor devices have been scaled down in size to provide a high integration level.

In a process of forming a gate electrode, a gate insulating layer may be damaged which decreases the reliability of a semiconductor device. Thus, research has been conducted to prevent damage to the gate insulating layer.

SUMMARY

Aspects of the present disclosure provide a method for fabricating a semiconductor device with increased reliability by preventing damage to a gate insulating layer through a passivation layer while an etching process for layers including titanium nitride (TiN) is performed.

According to an embodiment of the present disclosure, a method for fabricating a semiconductor device includes providing a substrate having first to fourth regions defined thereon, forming a first active pattern on the substrate in the first region, forming a second active pattern on the substrate in the second region, forming a third active pattern on the substrate in the third region, and forming a fourth active pattern on the substrate in the fourth region, each of the first to fourth active patterns extending in a first horizontal direction, forming a gate insulating layer on each of the first to fourth active patterns, forming a first layer on the gate insulating layer in the first to fourth regions, forming a first passivation layer containing a material having an etching selectivity with respect to the first layer on the first layer in the first to fourth regions, etching the first passivation layer formed in the second and fourth regions, forming a second layer on each of the first passivation layer in the first and third regions and the first layer in the second and fourth regions, forming a second passivation layer containing a material having an etching selectivity with respect to the second layer on the second layer in the first to fourth regions, etching the second passivation layer in the first, third and fourth regions, etching the second layer and the first passivation layer in the third region, forming a third layer on each of the second layer in the first and fourth regions, the second passivation layer in the second region, and the first layer in the third region, etching the third layer in the first and second regions and the second layer in the first region, forming a fourth layer on each of the first passivation layer in the first region, the second passivation layer in the second region, and the third layer in the third and fourth regions, etching the fourth layer in the first and second regions, etching the first passivation layer in the first region and the second passivation layer in the second region, and forming a fifth layer on each of the first layer in the first region, the second layer in the second region, and the fourth layer in the third and fourth regions.

According an embodiment of the present disclosure, a method for fabricating a semiconductor device includes providing a substrate having first to fourth regions defined thereon, the first and second regions are NMOS regions, and the third and fourth regions are PMOS regions, forming a first active pattern on the substrate in the first region, forming a second active pattern on the substrate in the second region, forming a third active pattern on the substrate in the third region, and forming a fourth active pattern on the substrate in the fourth region, each of the first to fourth active patterns extending in a first horizontal direction, forming a first dummy gate extending in a second horizontal direction that crosses the first horizontal direction on the first active pattern, forming a second dummy gate extending in the second horizontal direction on the second active pattern, forming a third dummy gate extending in the second horizontal direction on the third active pattern, and forming a fourth dummy gate extending in the second horizontal direction on the fourth active pattern, forming gate spacers on both sidewalls of each of the first to fourth dummy gates in the first horizontal direction, etching the first to fourth dummy gates to form first to fourth gate trenches in the first to fourth regions, respectively, forming a gate insulating layer along a sidewall and a bottom surface of each of the first to fourth gate trenches, forming a first layer on the gate insulating layer in the first to fourth regions, forming a first passivation layer on the first layer in the first to fourth regions, the first passivation layer containing a material having an etching selectivity with respect to the first layer, and the first passivation layer in direct contact with the first layer, etching the first passivation layer formed in the second and fourth regions, forming a second layer on each of the first passivation layer in the first and third regions and the first layer in the second and fourth regions, forming a second passivation layer containing a material having an etching selectivity with respect to the second layer on the second layer in the first to fourth regions, etching the second passivation layer in the first, third and fourth regions, etching the second layer and the first passivation layer in the third region, forming a third layer on each of the second layer in the first and fourth regions, the second passivation layer in the second region, and the first layer in the third region, etching the third layer in the first and second regions and the second layer in the first region, forming a fourth layer on each of the first passivation layer in the first region, the second passivation layer in the second region, and the third layer in the third and fourth regions, etching the fourth layer in the first and second regions, and etching the first passivation layer of the first region and the second passivation layer of the second region, wherein the first to fourth layers contain a same material as each other.

According to an embodiment of the present disclosure, a method for fabricating a semiconductor device includes providing a substrate having first to sixth regions defined thereon, the first to third regions are NMOS regions, the fourth to sixth regions are PMOS regions, forming a first active pattern on the substrate in the first region, forming a second active pattern on the substrate in the second region, forming a third active pattern on the substrate in the third region, forming a fourth active pattern on the substrate in the fourth region, forming a fifth active pattern on the substrate in the fifth region, and forming a sixth active pattern on the substrate in the sixth region, each of the first to sixth active patterns extending in a first horizontal direction, forming a gate insulating layer on each of the first to sixth active patterns, forming a first layer containing titanium nitride (TiN) on the gate insulating layer in the first to sixth regions, forming a first passivation layer containing a material having an etching selectivity with respect to the first layer on the first layer in the first to sixth regions, etching the first passivation layer formed in the third region, the fifth region, and the sixth region, forming a second layer on each of the first passivation layer in the first, second and fourth regions and the first layer in the third, fifth and sixth regions, forming a second passivation layer containing a material having an etching selectivity with respect to the second layer on the second layer in the first to sixth regions, etching the second passivation layer in the first, second, and fourth to sixth regions, etching the second layer and the first passivation layer in the fourth region, forming a third layer on each of the second layer in the first, second, fifth and sixth regions, the second passivation layer in the third region, and the first layer in the fourth region, etching the third layer of the first to third regions and the second layer of the first and second regions, forming a fourth layer on each of the first passivation layer in the first and second regions, the second passivation layer in the third region, and the third layer in the fourth to sixth regions, etching the fourth layer in the first to third regions, etching the first passivation layer in the first and second regions and the second passivation layer in the third region, forming a fifth layer on each of the first layer in the first and second regions, the second layer in the third region, and the fourth layer in the fourth to sixth regions, and forming a filling layer on the fifth layer in the first to sixth regions.

However, aspects of embodiments of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail non-limiting embodiments thereof with reference to the attached drawings, in which.

DETAILED DESCRIPTION OF EMBODIMENTS

Hereinafter, a semiconductor device fabricated by a method for fabricating the semiconductor device according to some embodiments of the present disclosure will be described with reference to FIGS. 1 to 8.

Figure 1:
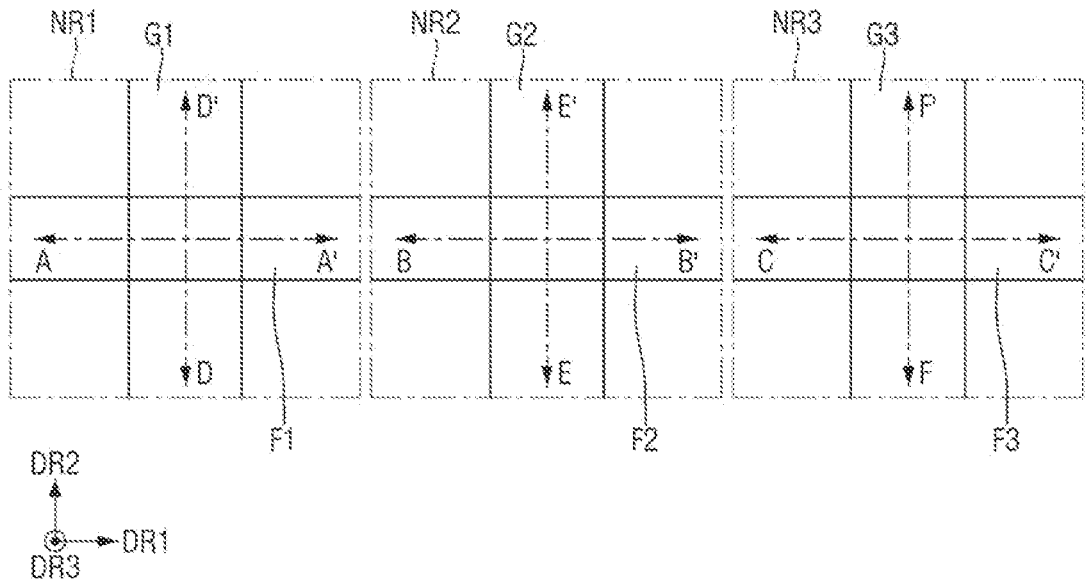
FIG. 1 is a schematic layout diagram illustrating an NMOS region of a semiconductor device fabricated by a semiconductor device fabricating method according to an embodiment of the present disclosure.
Figure 2:
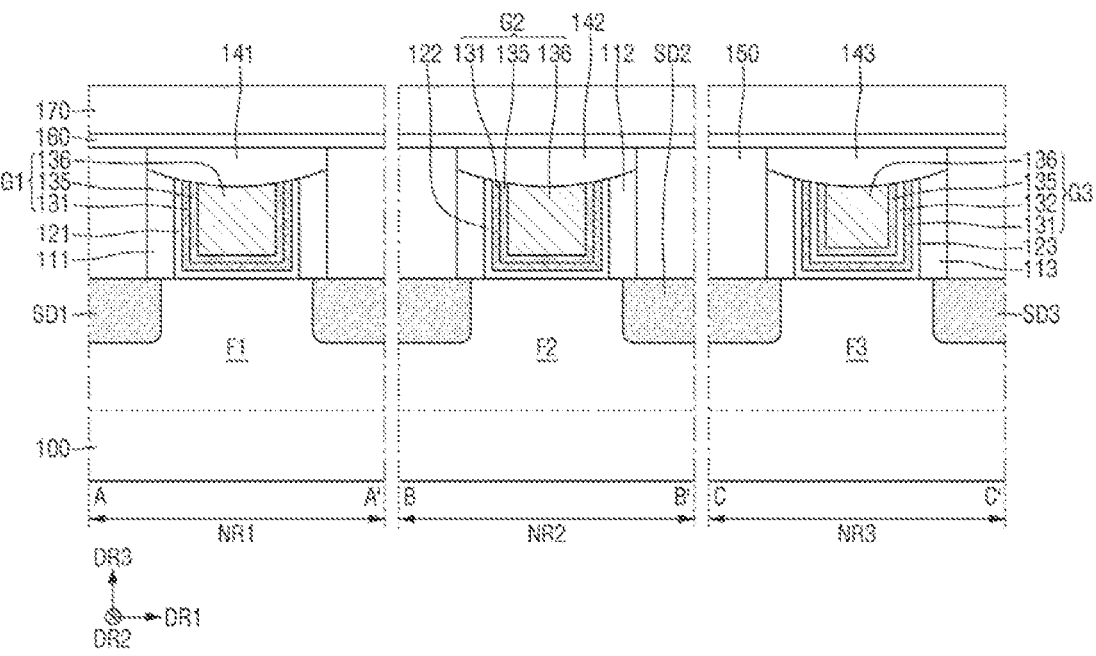
FIG. 2 is a cross-sectional view taken along lines A-A', B-B' and C-C' of FIG. 1 according to an embodiment of the present disclosure.
Figure 3:
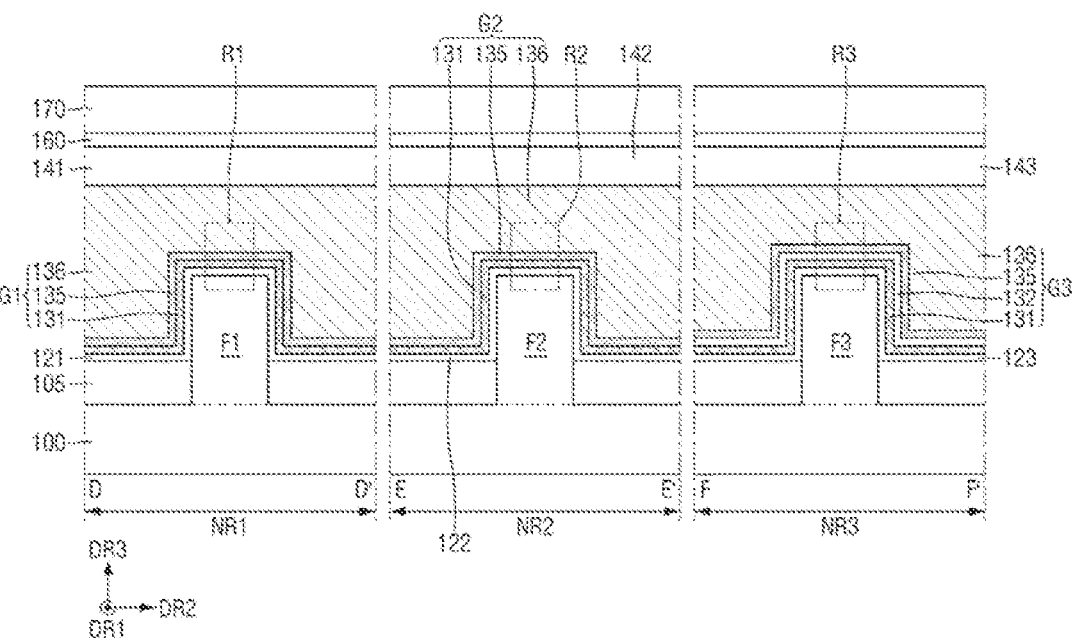
FIG. 3 is a cross-sectional view taken along lines D-D', E-E' and F-F' of FIG. 1 according to an embodiment of the present disclosure.
Figure 4:
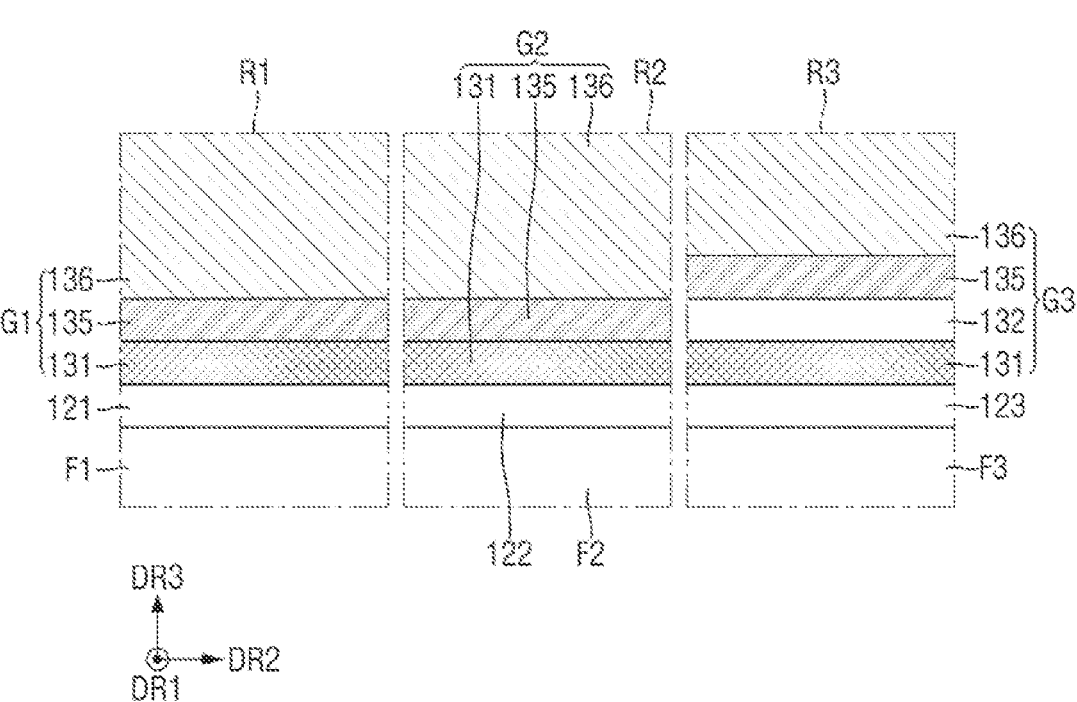
FIG. 4 is an enlarged view of regions R1, R2, and R3 of FIG. 3 according to an embodiment of the present disclosure.
Figure 5:
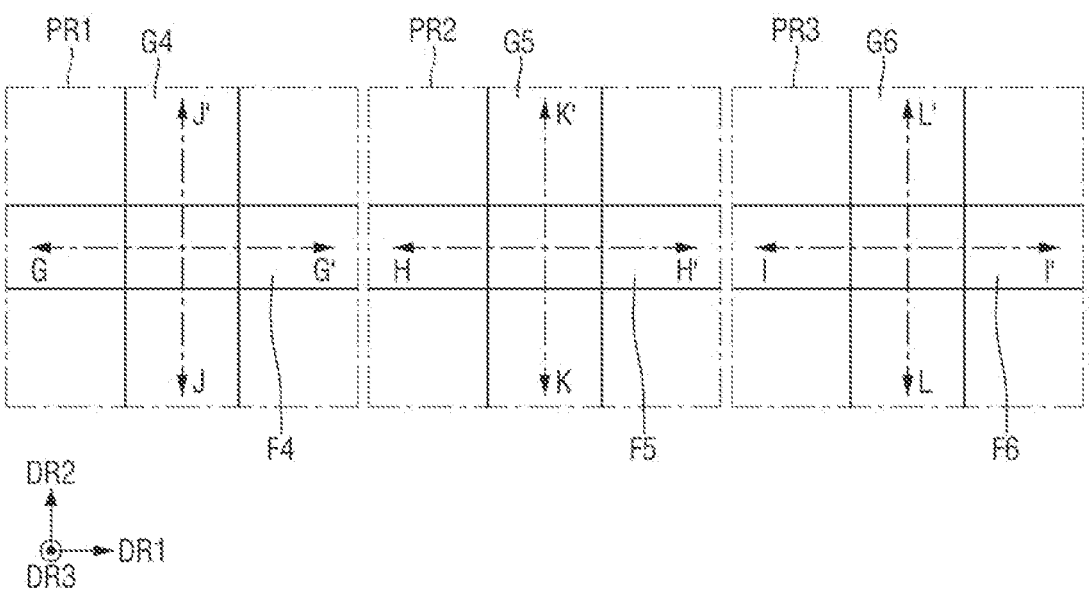
FIG. 5 is a schematic layout diagram illustrating a PMOS region of a semiconductor device fabricated by a semiconductor device fabricating method according to an embodiment of the present disclosure.
Figure 6:
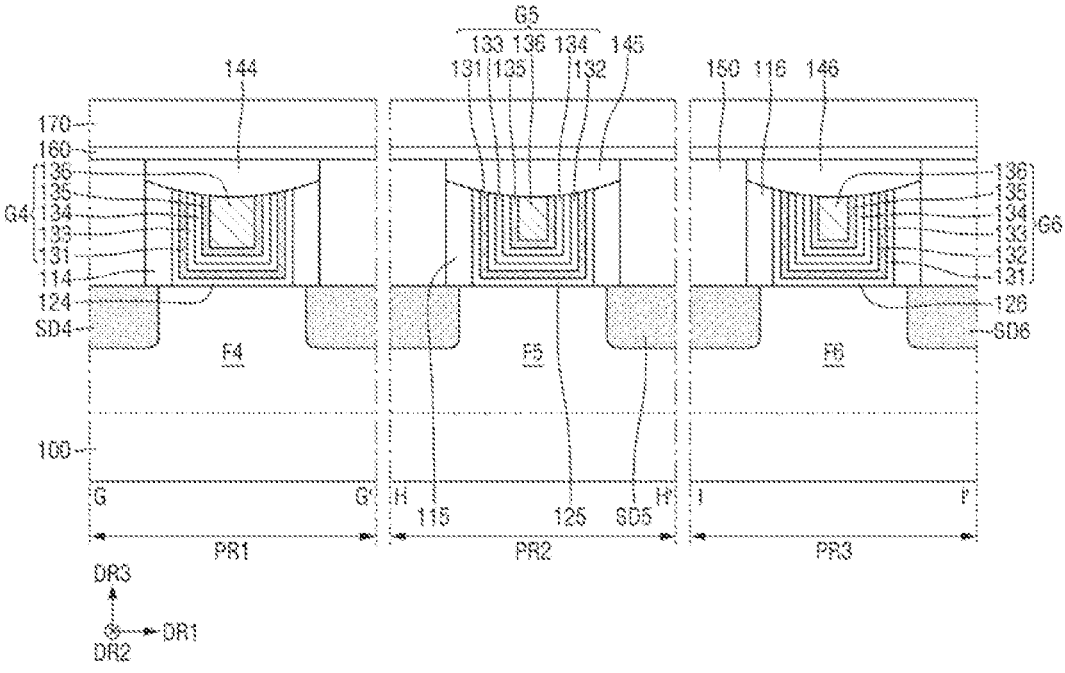
FIG. 6 is a cross-sectional view taken along lines G-G', H-H' and I-I' of FIG. 5 according to an embodiment of the present disclosure.
Figure 7:
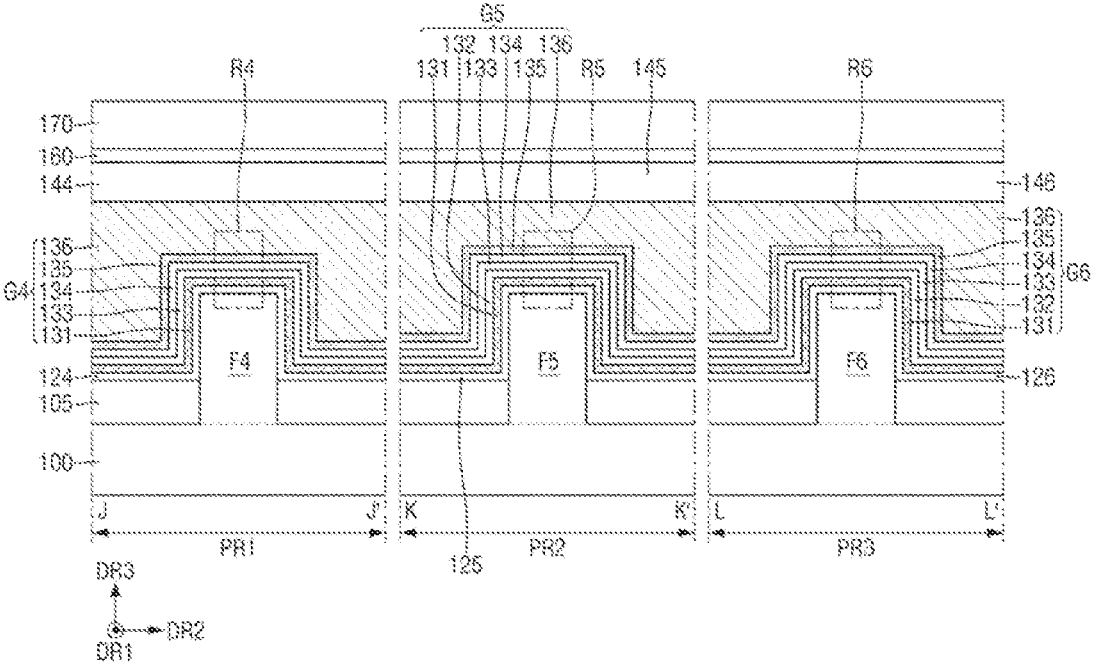
FIG. 7 is a cross-sectional view taken along lines J-J', K-K' and L-L' of FIG. 5 according to an embodiment of the present disclosure.
Figure 8:
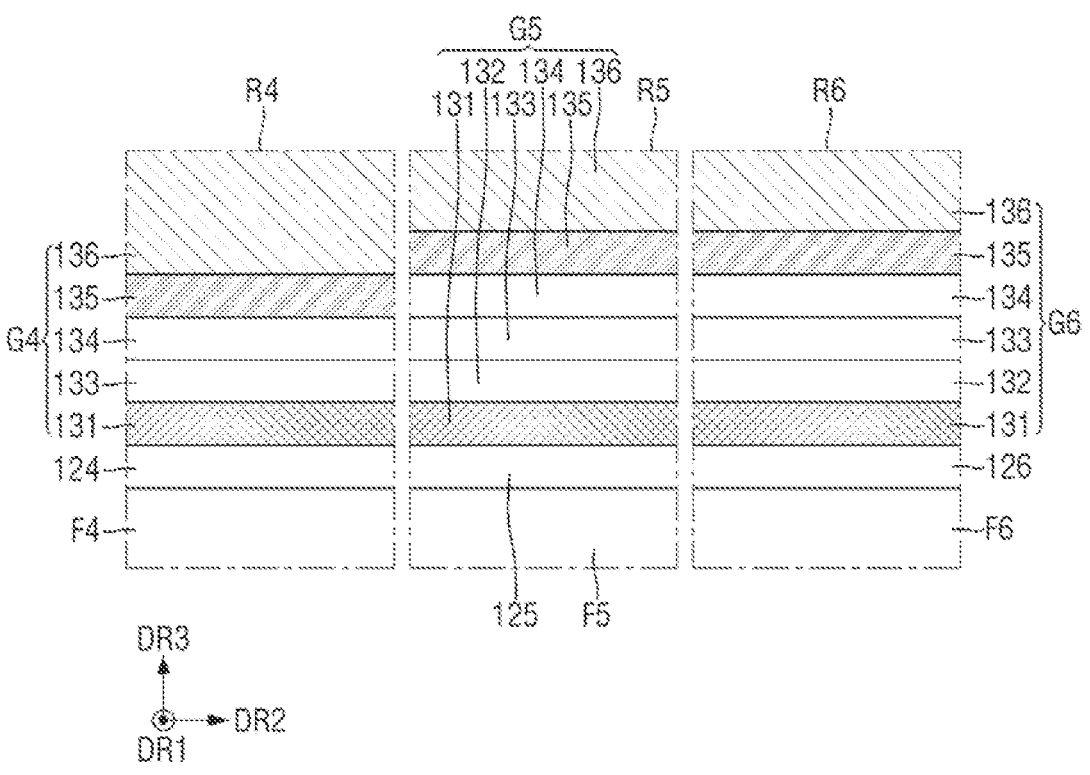
FIG. 8 is an enlarged view of regions R4, R5, and R6 of FIG. 7 according to an embodiment of the present disclosure.
Figure 9:
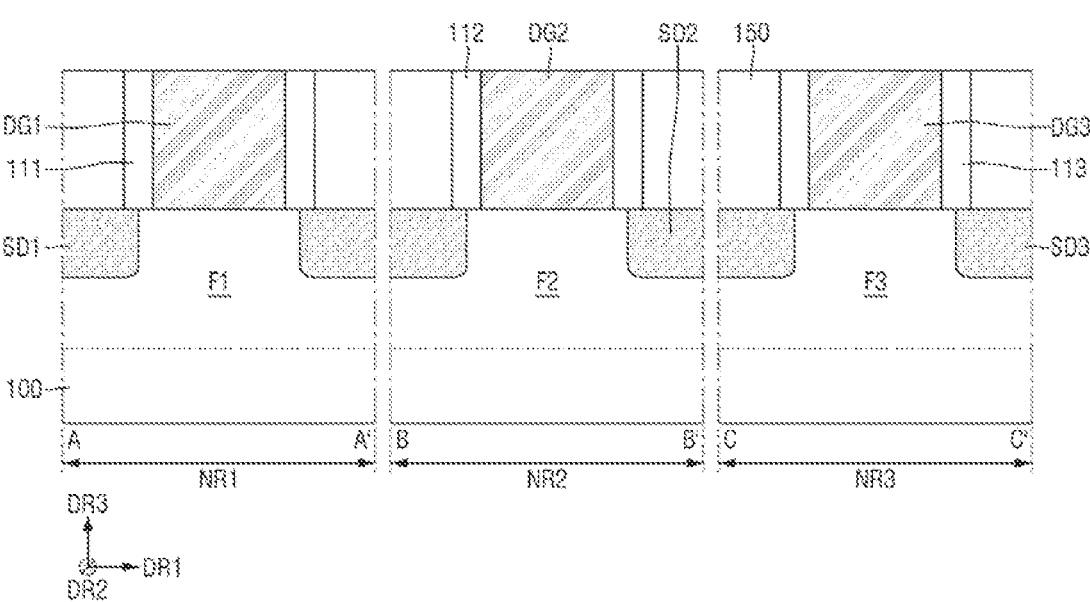
FIGS. 9 to 40 are diagrams illustrating intermediate steps of a method for fabricating a semiconductor device according to some embodiments of the present disclosure.
Figure 10:
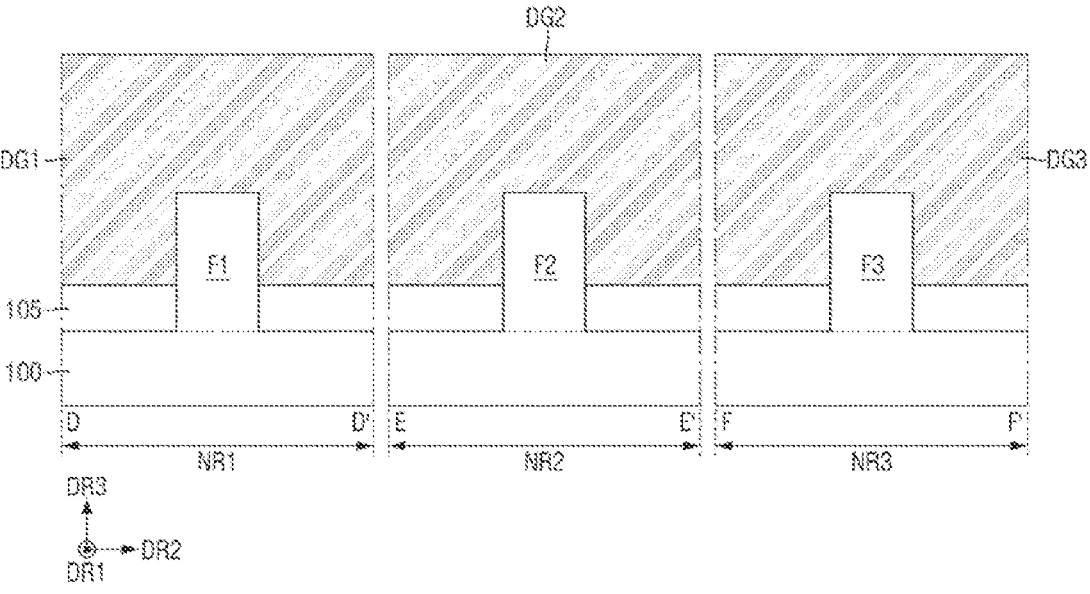
Figure 11:
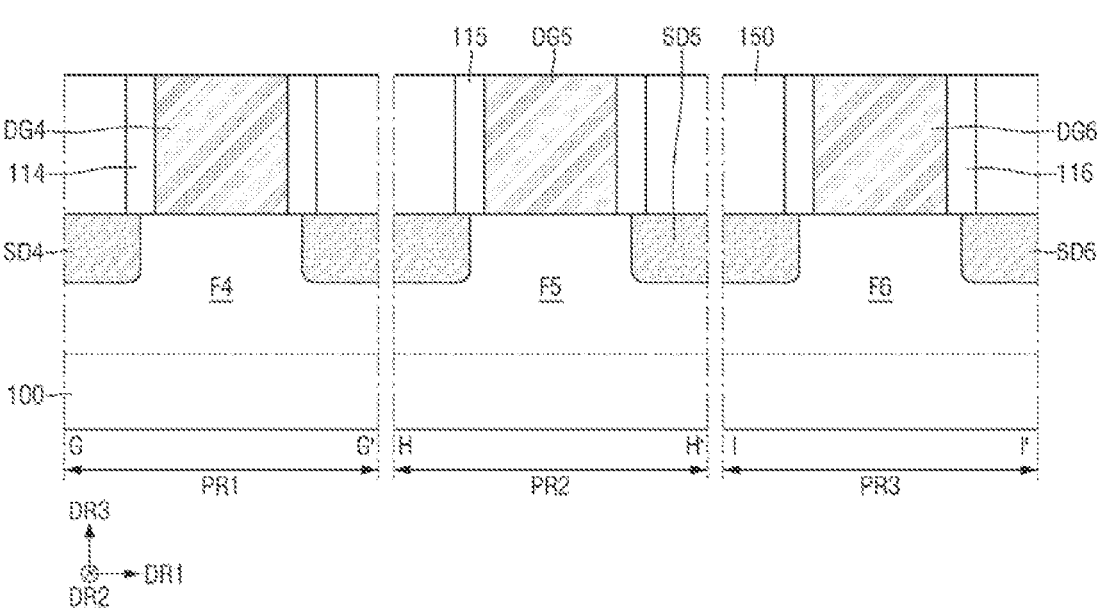
Figure 12:
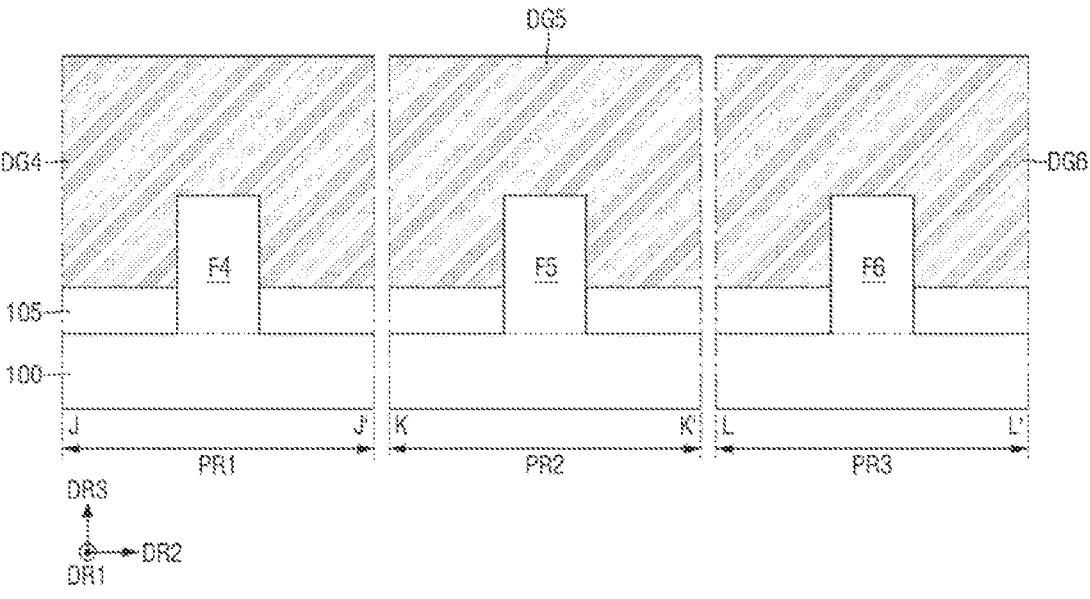
Figure 13:
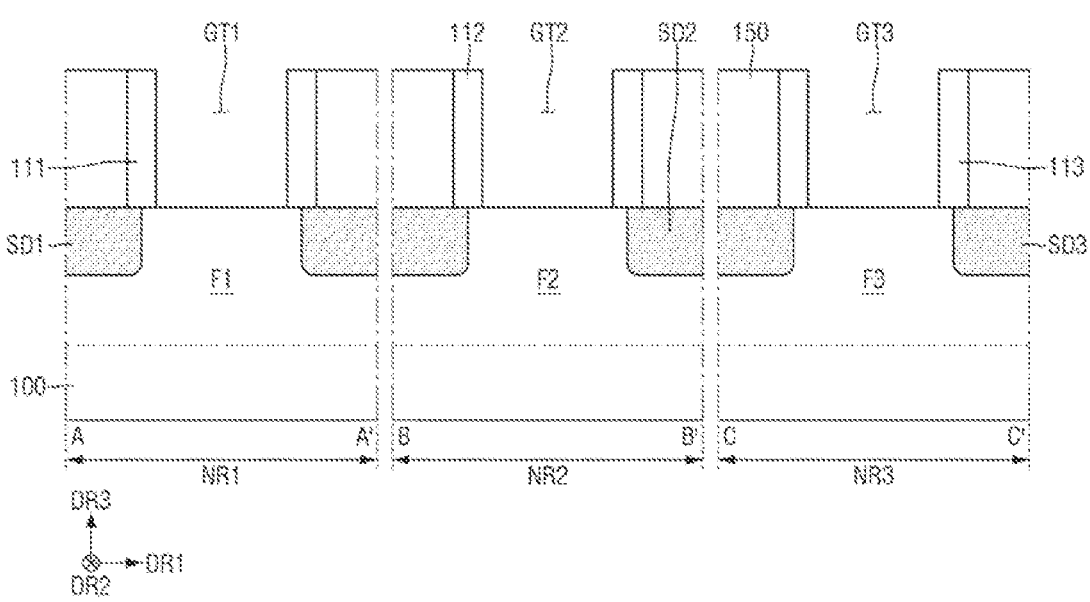
Figure 14:
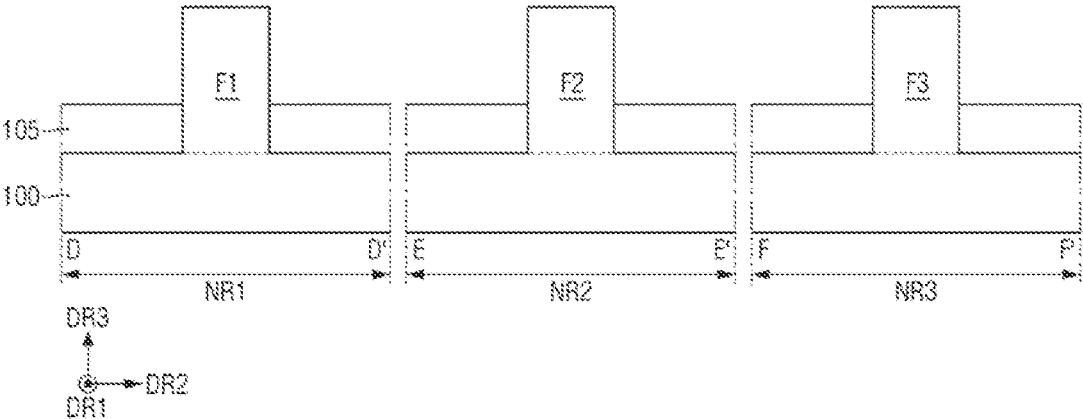

FIG. 1 is a schematic layout diagram illustrating an NMOS region of a semiconductor device fabricated by a semiconductor device fabricating method according to some embodiments of the present disclosure. FIG. 2 is a cross-sectional view taken along lines A-A', B-B' and C-C' of FIG. 1. FIG. 3 is a cross-sectional view taken along lines D-D', E-E' and F-F' of FIG. 1. FIG. 4 is an enlarged view of regions R1, R2, and R3 of FIG. 3. FIG. 5 is a schematic layout diagram illustrating a PMOS region of a semiconductor device fabricated by a semiconductor device fabricating method according to some embodiments of the present disclosure. FIG. 6 is a cross-sectional view taken along lines G-G', H-H' and I-I' of FIG. 5. FIG. 7 is a cross-sectional view taken along lines J-J', K-K' and L-L' of FIG. 5. FIG. 8 is an enlarged view of regions R4, R5, and R6 of FIG. 7.

Referring to FIGS. 1 to 8, a semiconductor device fabricated by a semiconductor device fabricating method according to some embodiments of the present disclosure includes a substrate 100, a field insulating layer 105, first to sixth active patterns F1 to F6, first to sixth gate electrodes G1 to G6, first to sixth gate spacers 111 to 116, first to sixth gate insulating layers 121 to 126, first to fifth layers 131 to 135, a filling layer 136, first to sixth capping patterns 141 to 146, first to sixth source/drain regions SD1 to SD6, a first interlayer insulating layer 150, an etch stop layer 160, and a second interlayer insulating layer 170.

In an embodiment, the substrate 100 may be a silicon substrate or silicon-on-insulator (SOI) substrate. Alternatively, the substrate 100 may include silicon germanium, silicon germanium on insulator (SGOI), indium antimonide, a lead tellurium compound, indium arsenide, indium phosphide, gallium arsenide, or gallium antimonide. However, embodiments of the present disclosure are not necessarily limited thereto.

First to sixth regions NR1, NR2, NR3, PR1, PR2, and PR3 may be defined on the substrate 100. For example, in an embodiment each of the first to third regions NR1, NR2, and NR3 may be an NMOS region. For example, in an embodiment the first region NR1 may be a region where a super low voltage NMOS transistor is formed, the second region NR2 may be a region where a low voltage NMOS transistor is formed, and the third region NR3 may be a region where a regular voltage NMOS transistor is formed. However, embodiments of the present disclosure are not necessarily limited thereto and the number of the regions defined in the substrate 100 may vary.

In addition, for example, each of the fourth to sixth regions PR1, PR2, and PR3 may be a PMOS region. For example, in an embodiment the fourth region PR1 may be a region where a super low voltage PMOS transistor is formed, the fifth region PR2 may be a region where a low voltage PMOS transistor is formed, and the sixth region PR3 may be a region where a regular voltage PMOS transistor is formed.

Hereinafter, each of a first horizontal direction DR1 and a second horizontal direction DR2 may be defined as a direction parallel to the top surface of the substrate 100. The second horizontal direction DR2 may be defined as a direction different from the first horizontal direction DR1. For example, in an embodiment the second horizontal direction DR2 may be perpendicular to the first horizontal direction DR1. However, embodiments of the present disclosure are not necessarily limited thereto and the first and second directions DR1, DR2 may cross each other at various different angles. A vertical direction DR3 may be defined as a direction perpendicular to each of the first horizontal direction DR1 and the second horizontal direction DR2. For example, the vertical direction DR3 may be defined as a direction perpendicular to the top surface of the substrate 100.

The first active pattern F1 may extend in the first horizontal direction DR1 in the first region NR1. The second active pattern F2 may extend in the first horizontal direction DR1 in the second region NR2. The third active pattern F3 may extend in the first horizontal direction DR1 in the third region NR3. The fourth active pattern F4 may extend in the first horizontal direction DR1 in the fourth region PR1. The fifth active pattern FS may extend in the first horizontal direction DR1 in the fifth region PR2. The sixth active pattern F6 may extend in the first horizontal direction DR1 in the sixth region PR3. Each of the first to sixth active patterns F1 to F6 may protrude from the top surface of the substrate 100 in the vertical direction DR3. For example, each of the first to sixth active patterns F1 to F6 may be a portion of the substrate 100 or may include an epitaxial layer grown from the substrate 100.

The field insulating layer 105 may be disposed on the top surface of the substrate 100 in each of the first to sixth regions NR1, NR2, NR3, PR1, PR2, and PR3. The field insulating layer 105 may surround the sidewalls of the first to sixth active patterns F1 to F6. For example, the top surface of each of the first to sixth active patterns F1 to F6 may protrude further in the vertical direction DR3 than the top surface of the field insulating layer 105. In an embodiment the field insulating layer 105 may include, for example, an oxide layer, a nitride layer, an oxynitride layer, or a combination layer thereof. However, embodiments of the present disclosure are not necessarily limited thereto.

The first gate spacer 111 may be disposed in the first region NR1. The first gate spacer 111 may extend in the second horizontal direction DR2 on the field insulating layer 105 and the first active pattern F1. The second gate spacer 112 may be disposed in the second region NR2. The second gate spacer 112 may extend in the second horizontal direction DR2 on the field insulating layer 105 and the second active pattern F2. The third gate spacer 113 may be disposed in the third region NR3. The third gate spacer 113 may extend in the second horizontal direction DR2 on the field insulating layer 105 and the third active pattern F3.

The fourth gate spacer 114 may be disposed in the fourth region PR1. The fourth gate spacer 114 may extend in the second horizontal direction DR2 on the field insulating layer 105 and the fourth active pattern F4. The fifth gate spacer 115 may be disposed in the fifth region PR2. The fifth gate spacer 115 may extend in the second horizontal direction DR2 on the field insulating layer 105 and the fifth active pattern F5. The sixth gate spacer 116 may be disposed in the sixth region PR3. The sixth gate spacer 116 may extend in the second horizontal direction DR2 on the field insulating layer 105 and the sixth active pattern F6.

For example, in an embodiment each of the first to sixth gate spacers 111 to 116 may include two spacers that are spaced apart from each other in the first horizontal direction DR1. In an embodiment, each of the first to sixth gate spacers 111 to 116 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC) or a combination thereof. However, embodiments of the present disclosure are not necessarily limited thereto.

The first gate insulating layer 121 may be disposed between the first gate spacers 111 along the sidewalls (e.g., inner sidewalls) of the first gate spacers 111. The first gate insulating layer 121 may be disposed on (e.g., disposed directly thereon) the sidewall and top surface of the first active pattern F1 and the top surface of the field insulating layer 105 between the first gate spacers 111. The second gate insulating layer 122 may be disposed between the second gate spacers 112 along the sidewalls (e.g., inner sidewalls) of the second gate spacers 112. The second gate insulating layer 122 may be disposed on (e.g., disposed directly thereon) the sidewall and top surface of the second active pattern F2 and the top surface of the field insulating layer 105 between the second gate spacers 112. The third gate insulating layer 123 may be disposed between the third gate spacers 113 along the sidewalls (e.g., inner sidewalls) of the third gate spacers 113. The third gate insulating layer 123 may be disposed on (e.g., disposed directly thereon) the sidewall and top surface of the third active pattern F3 and the top surface of the field insulating layer 105 between the third gate spacers 113.

The fourth gate insulating layer 124 may be disposed between the fourth gate spacers 114 along the sidewalls (e.g., inner sidewalls) of the fourth gate spacers 114. The fourth gate insulating layer 124 may be disposed on (e.g., disposed directly thereon) the sidewall and top surface of the fourth active pattern F4 and the top surface of the field insulating layer 105 between the fourth gate spacers 114. The fifth gate insulating layer 125 may be disposed between the fifth gate spacers 115 along the sidewalls (e.g., inner sidewalls) of the fifth gate spacers 115. The fifth gate insulating layer 125 may be disposed on (e.g., disposed directly thereon) the sidewall and top surface of the fifth active pattern FS and the top surface of the field insulating layer 105 between the fifth gate spacers 115. The sixth gate insulating layer 126 may be disposed between the sixth gate spacers 116 along the sidewalls (e.g., inner sidewalls) of the sixth gate spacers 116. The sixth gate insulating layer 126 may be disposed on (e.g., disposed directly thereon) the sidewall and top surface of the sixth active pattern F6 and the top surface of the field insulating layer 105 between the sixth gate spacers 116.

In an embodiment, each of the first to sixth gate insulating layers 121 to 126 may include at least one of silicon oxide, silicon oxynitride, silicon nitride, or a high dielectric constant material having a higher dielectric constant than silicon oxide. The high-k material may include, for example, at least one selected from the group of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. However, embodiments of the present disclosure are not necessarily limited thereto.

For example, each of the first gate insulating layer 121, the third gate insulating layer 123, and the fifth gate insulating layer 125 may include different materials from each of the second gate insulating layer 122, the fourth gate insulating layer 124, and the sixth gate insulating layer 126. For example, in an embodiment each of the first gate insulating layer 121, the third gate insulating layer 123, and the fifth gate insulating layer 125 may include lanthanum (La), and each of the second gate insulating layer 122, the fourth gate insulating layer 124, and the sixth gate insulating layer 126 may not include lanthanum (La). However, embodiments of the present disclosure are not necessarily limited thereto.

A semiconductor device according to some embodiments may include a negative capacitance field effect transistor (NCFET) using a negative capacitor. For example, each of the first to sixth gate insulating layers 121 to 126 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

In an embodiment in which a ferroelectric material layer having a negative capacitance and a paraelectric material layer having a positive capacitance are connected in series, the total capacitance value of the ferroelectric material layer and the paraelectric material layer connected in series may increase. By using an increase in the total capacitance value, the transistor including the ferroelectric material layer may have a subthreshold swing (SS) less than about 60 mV/decade at room temperature.

The ferroelectric material layer may have ferroelectric properties. In an embodiment, the ferroelectric material layer may include, for example, at least one of hafnium oxide, hafnium zirconium oxide, barium strontium titanium oxide, barium titanium oxide, or lead zirconium titanium oxide. In an embodiment, as one example, the hafnium zirconium oxide may be a material containing hafnium oxide doped with zirconium (Zr). As another example, the hafnium zirconium oxide may be a compound of hafnium (Hf), zirconium (Zr), and oxygen (O). However, embodiments of the present disclosure are not necessarily limited thereto.

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

In an embodiment in which the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

In an embodiment in which the dopant is aluminum (Al), the ferroelectric material layer may include about 3 to about 8 atomic percent (at %) of aluminum. In this embodiment, the ratio of the dopant may be a ratio of aluminum to the sum of hafnium and aluminum.

In an embodiment in which the dopant is silicon (Si), the ferroelectric material layer may include about 2 to about 10 at % of silicon. In an embodiment in which the dopant is yttrium (Y), the ferroelectric material layer may include about 2 to about 10 at % of yttrium. In an embodiment in which the dopant is gadolinium (Gd), the ferroelectric material layer may include about 1 to about 7 at % of gadolinium. In an embodiment in which the dopant is zirconium (Zr), the ferroelectric material layer may include about 50 to about 80 at % of zirconium.

The paraelectric material layer may have paraelectric properties. In an embodiment, the paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide. However, embodiments of the present disclosure are not necessarily limited thereto.

The ferroelectric material layer and the paraelectric material layer may include the same material as each other. The ferroelectric material layer may have ferroelectric properties, but the paraelectric material layer may not have ferroelectric properties. For example, in an embodiment in which the ferroelectric material layer and the paraelectric material layer both include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. In an embodiment, the thickness of the ferroelectric material layer may be, for example, in a range of about 0.5 nm to about 10 nm. However, embodiments of the present disclosure are not necessarily limited thereto. Since a critical thickness at which each ferroelectric material exhibits ferroelectric properties may be different, the thickness of the ferroelectric material layer may vary depending on the ferroelectric material.

In one example, each of the first to sixth gate insulating layers 121 to 126 may include one ferroelectric material layer. In another example, each of the first to sixth gate insulating layers 121 to 126 may include a plurality of ferroelectric material layers spaced apart from each other. In an embodiment, each of the first to sixth gate insulating layers 121 to 126 may have a stacked structure in which a plurality of ferroelectric material layers and a plurality of paraelectric material layers are alternately stacked.

The first gate electrode G1 may be disposed in the first region NR1. The first gate electrode G1 may be disposed on the first gate insulating layer 121 between the first gate spacers 111 (e.g., in the first direction DR1). The first gate electrode G1 may extend in the second horizontal direction DR2 on the field insulating layer 105 and the first active pattern F1. For example, in an embodiment the first gate electrode G1 may include the first layer 131, the fifth layer 135, and the filling layer 136. In an embodiment, the first layer 131, the fifth layer 135, and the filling layer 136 may be sequentially disposed on the first gate insulating layer 121 between the first gate spacers 111. The first layer 131 may be in direct contact with the first gate insulating layer 121. For example, each of the first layer 131 and the fifth layer 135 may be conformally formed. The filling layer 136 may fill a space between the first gate spacers 111 on (e.g., directly thereon) the fifth layer 135. For example, the filling layer 136 may directly contact an entirety of an upper surface and inner sidewalls of the fifth layer 135. The first layer 131, the fifth layer 135, and the filling layer 136 may be sequentially in direct contact with each other between the first gate spacers 111.

The second gate electrode G2 may be disposed in the second region NR2. The second gate electrode G2 may be disposed on the second gate insulating layer 122 between the second gate spacers 112 (e.g., in the first direction DR1). The second gate electrode G2 may extend in the second horizontal direction DR2 on the field insulating layer 105 and the second active pattern F2. For example, in an embodiment the second gate electrode G2 may include the first layer 131, the fifth layer 135, and the filling layer 136. In an embodiment, the first layer 131, the fifth layer 135, and the filling layer 136 may be sequentially disposed on the second gate insulating layer 122 between the second gate spacers 112. The first layer 131 may be in direct contact with the second gate insulating layer 122. For example, each of the first layer 131 and the fifth layer 135 may be conformally formed. The filling layer 136 may fill a space between the second gate spacers 112 on (e.g., directly on) the fifth layer 135. For example, the filling layer 136 may directly contact an entirety of an upper surface and inner sidewalls of the fifth layer 135. The first layer 131, the fifth layer 135, and the filling layer 136 may sequentially be in direct contact with each other between the second gate spacers 112.

The third gate electrode G3 may be disposed in the third region NR3. The third gate electrode G3 may be disposed on the third gate insulating layer 123 between the third gate spacers 113 (e.g., in the first direction DR1). The third gate electrode G3 may extend in the second horizontal direction DR2 on the field insulating layer 105 and the third active pattern F3. For example, in an embodiment the third gate electrode G3 may include the first layer 131, the second layer 132, the fifth layer 135, and the filling layer 136. In an embodiment, the first layer 131, the second layer 132, the fifth layer 135, and the filling layer 136 may be sequentially disposed on the third gate insulating layer 123 between the third gate spacers 113. The first layer 131 may be in direct contact with the third gate insulating layer 123. For example, each of the first layer 131, the second layer 132, and the fifth layer 135 may be conformally formed. The filling layer 136 may fill a space between the third gate spacers 113 on (e.g., directly thereon) the fifth layer 135. For example, the filling layer 136 may directly contact an entirety of an upper surface and inner sidewalls of the fifth layer 135. The first layer 131, the second layer 132, the fifth layer 135, and the filling layer 136 may be sequentially in direct contact with each other between the third gate spacers 113.

The fourth gate electrode G4 may be disposed in the fourth region PR1. The fourth gate electrode G4 may be disposed on the fourth gate insulating layer 124 between the fourth gate spacers 114 (e.g., in the first direction DR1). The fourth gate electrode G4 may extend in the second horizontal direction DR2 on the field insulating layer 105 and the fourth active pattern F4. For example, in an embodiment the fourth gate electrode G4 may include the first layer 131, the third layer 133, the fourth layer 134, the fifth layer 135, and the filling layer 136. In an embodiment, the first layer 131, the third layer 133, the fourth layer 134, the fifth layer 135, and the filling layer 136 may be sequentially disposed on the fourth gate insulating layer 124 between the fourth gate spacers 114. The first layer 131 may be in direct contact with the fourth gate insulating layer 124. For example, each of the first layer 131, the third layer 133, the fourth layer 134, and the fifth layer 135 may be conformally formed. The filling layer 136 may fill a space between the fourth gate spacers 114 on (e.g., directly thereon) the fifth layer 135. For example, the filling layer 136 may directly contact an entirety of an upper surface and inner sidewalls of the fifth layer 135. The first layer 131, the third layer 133, the fourth layer 134, the fifth layer 135, and the filling layer 136 may be sequentially in direct contact with each other between the fourth gate spacers 114.

The fifth gate electrode G5 may be disposed in the fifth region PR2. The fifth gate electrode G5 may be disposed on the fifth gate insulating layer 125 between the fifth gate spacers 115 (e.g., in the first direction DR1). The fifth gate electrode G5 may extend in the second horizontal direction DR2 on the field insulating layer 105 and the fifth active pattern F5. For example, in an embodiment the fifth gate electrode G5 may include the first layer 131, the second layer 132, the third layer 133, the fourth layer 134, the fifth layer 135, and the filling layer 136. The first layer 131, the second layer 132, the third layer 133, the fourth layer 134, the fifth layer 135, and the filling layer 136 may be sequentially disposed on the fifth gate insulating layer 125 between the fifth gate spacers 115. The first layer 131 may be in direct contact with the fifth gate insulating layer 125. For example, each of the first layer 131, the second layer 132, the third layer 133, the fourth layer 134, and the fifth layer 135 may be conformally formed. The filling layer 136 may fill a space between the fifth gate spacers 115 on (e.g., directly thereon) the fifth layer 135. For example, the filling layer 136 may directly contact an entirety of an upper surface and inner sidewalls of the fifth layer 135. The first layer 131, the second layer 132, the third layer 133, the fourth layer 134, the fifth layer 135, and the filling layer 136 may be sequentially in direct contact with each other between the fifth gate spacers 115.

The sixth gate electrode G6 may be disposed in the sixth region PR3. The sixth gate electrode G6 may be disposed on the sixth gate insulating layer 126 between the sixth gate spacers 116 (e.g., in the first direction DR1). The sixth gate electrode G6 may extend in the second horizontal direction DR2 on the field insulating layer 105 and the sixth active pattern F6. For example, in an embodiment the sixth gate electrode G6 may include the first layer 131, the second layer 132, the third layer 133, the fourth layer 134, the fifth layer 135, and the filling layer 136. In an embodiment, the first layer 131, the second layer 132, the third layer 133, the fourth layer 134, the fifth layer 135, and the filling layer 136 may be sequentially disposed on the sixth gate insulating layer 126 between the sixth gate spacers 116. The first layer 131 may be in direct contact with the sixth gate insulating layer 126. For example, each of the first layer 131, the second layer 132, the third layer 133, the fourth layer 134, and the fifth layer 135 may be conformally formed. The filling layer 136 may fill a space between the sixth gate spacers 116 on (e.g., directly thereon) the fifth layer 135. For example, the filling layer 136 may directly contact an entirety of an upper surface and inner sidewalls of the fifth layer 135. The first layer 131, the second layer 132, the third layer 133, the fourth layer 134, the fifth layer 135, and the filling layer 136 may be sequentially in direct contact with each other between the sixth gate spacers 116.

For example, the first to fourth layers 131, 132, 133, and 134 may include the same material as each other. For example, in an embodiment each of the first to fourth layers 131, 132, 133, and 134 may include titanium nitride (TiN). For example, the fifth layer 135 may include a material different from each of the first to fourth layers 131, 132, 133, and 134. For example, the fifth layer 135 may include titanium aluminum carbide (TiAlC). However, embodiments of the present disclosure are not necessarily limited thereto.

It is illustrated in the drawings that the filling layer 136 is formed as a single layer. However, embodiments of the present disclosure are not necessarily limited thereto. In some other embodiments, the filling layer 136 may be formed as a multilayer. In an embodiment, the filling layer 136 may include, for example, at least one selected from the group of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAiN), tungsten nitride (WN), ruthenium (Ru), titanium aluminum (TiAl), titanium aluminum carbonitride (TiAlC-N), titanium aluminum carbide (TiAlC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. The filling layer 136 may include, for example, conductive metal oxide, conductive metal oxynitride or the like, and may include an oxidized form of the aforementioned material.

The first capping pattern 141 may extend in the second horizontal direction DR2 on (e.g., directly thereon) the first gate spacer 111 and the first gate electrode G1. The second capping pattern 142 may extend in the second horizontal direction DR2 on (e.g., directly thereon) the second gate spacer 112 and the second gate electrode G2. The third capping pattern 143 may extend in the second horizontal direction DR2 on (e.g., directly thereon) the third gate spacer 113 and the third gate electrode G3. The fourth capping pattern 144 may extend in the second horizontal direction DR2 on (e.g., directly thereon) the fourth gate spacer 114 and the fourth gate electrode G4. The fifth capping pattern 145 may extend in the second horizontal direction DR2 on (e.g., directly thereon) the fifth gate spacer 115 and the fifth gate electrode G5. The sixth capping pattern 146 may extend in the second horizontal direction DR2 on (e.g., directly thereon) the sixth gate spacer 116 and the sixth gate electrode G6.

For example, in an embodiment the first to sixth capping patterns 141 to 146 may be in direct contact with the top surfaces of the first to sixth gate spacers 111 to 116, respectively. However, embodiments of the present disclosure are not necessarily limited thereto. For example, in some embodiments, the first to sixth capping patterns 141 to 146 may be disposed between the first to sixth gate spacers 111 to 116, respectively. For example, the first to sixth capping patterns 141 to 146 may be in direct contact with the sidewalls of the first to sixth gate spacers 111 to 116, respectively. In an embodiment, each of the first to sixth capping patterns 141 to 146 may include, for example, at least one of silicon nitride (SiN), silicon oxynitride (SiON), silicon oxide (SiO$_2$), silicon carbonitride (SiCN), silicon oxycarbonitride (SiOCN), or a combination thereof. However, embodiments of the present disclosure are not necessarily limited thereto.

The first source/drain region SD1 may be disposed on at least one side of the first gate electrode G1 on the first active pattern F1. For example, in an embodiment the first source/drain region SD1 may be disposed on both sides of the first gate electrode G1 on the first active pattern F1. The second source/drain region SD2 may be disposed on at least one side of the second gate electrode G2 on the second active pattern F2. For example, in an embodiment the second source/drain region SD2 may be disposed on both sides of the second gate electrode G2 on the second active pattern F2. The third source/drain region SD3 may be disposed on at least one side of the third gate electrode G3 on the third active pattern F3. For example, in an embodiment the third source/drain region SD3 may be disposed on both sides of the third gate electrode G3 on the third active pattern F3.

The fourth source/drain region SD4 may be disposed on at least one side of the fourth gate electrode G4 on the fourth active pattern F4. For example, in an embodiment the fourth source/drain region SD4 may be disposed on both sides of the fourth gate electrode G4 on the fourth active pattern F4. The fifth source/drain region SD5 may be disposed on at least one side of the fifth gate electrode G5 on the fifth active pattern FS. For example, in an embodiment the fifth source/drain region SD5 may be disposed on both sides of the fifth gate electrode G5 on the fifth active pattern F5. The sixth source/drain region SD6 may be disposed on at least one side of the sixth gate electrode G6 on the sixth active pattern F6. For example, in an embodiment the sixth source/drain region SD6 may be disposed on both sides of the sixth gate electrode G6 on the sixth active pattern F6.

The first interlayer insulating layer 150 may be disposed on the field insulating layer 105 and the first to sixth active patterns F1 to F6. The first interlayer insulating layer 150 may cover each of the first to sixth source/drain regions SD1 to SD6. The first interlayer insulating layer 150 may surround the sidewall of each of the first to sixth gate spacers 111 to 116 (e.g., in the first direction DR1). The first interlayer insulating layer 150 may surround the sidewall of each of the first to sixth capping patterns 141 to 146 (e.g., in the first direction DR1). For example, in an embodiment the top surface of the first interlayer insulating layer 150 may be formed on the same plane (e.g., in the third direction DR3) as the top surface of each of the first to sixth capping patterns 141 to 146. However, embodiments of the present disclosure are not necessarily limited thereto. For example, in some embodiments, the first interlayer insulating layer 150 may cover the top surface of each of the first to sixth capping patterns 141 to 146.

In an embodiment, the first interlayer insulating layer 150 may include, for example, at least one of silicon oxide, silicon nitride, silicon oxynitride, or a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof. However, embodiments of the present disclosure are not necessarily limited thereto.

The etch stop layer 160 may be disposed on the top surfaces of the first interlayer insulating layer 150 and the first to sixth capping patterns 141 to 146. It is illustrated in the drawings that the etch stop layer 160 is formed as a single layer. However, embodiments of the present disclosure are not necessarily limited thereto. For example, in some embodiments, the etch stop layer 160 may be formed as a multilayer. In an embodiment, the etch stop layer 160 may include, for example, at least one of aluminum oxide, aluminum nitride, hafnium oxide, zirconium oxide, silicon oxide, silicon nitride, silicon oxynitride, or a low-k material. However, embodiments of the present disclosure are not necessarily limited thereto. The second interlayer insulating layer 170 may be disposed on (e.g., disposed directly thereon in the third direction DR3) the etch stop layer 160. In an embodiment, the second interlayer insulating layer 170 may include, for example, at least one of silicon oxide, silicon nitride, silicon oxynitride, or a low dielectric constant material. However, embodiments of the present disclosure are not necessarily limited thereto.

Hereinafter, a method for fabricating a semiconductor device according to some embodiments of the present disclosure will be described with reference to FIGS. 1 to 40.

FIGS. 9 to 40 are diagrams illustrating intermediate steps of a method for fabricating a semiconductor device according to some embodiments of the present disclosure.

Referring to FIGS. 9 to 12, the substrate 100 on which first to sixth regions NR1, NR2, NR3, PR1, PR2, and PR3 are defined may be provided. For example, in an embodiment each of the first to third regions NR1, NR2, and NR3 may be an NMOS region. In an embodiment, each of the fourth to sixth regions PR1, PR2, and PR3 may be a PMOS region.

The substrate 100 may be partially etched to form the first to sixth active patterns F1 to F6. Each of the first to sixth active patterns F1 to F6 may protrude from the remaining top surface of the substrate 100 in the vertical direction DR3. For example, the first active pattern F1 may extend in the first horizontal direction DR1 on the substrate 100 in the first region NR1. The second active pattern F2 may extend in the first horizontal direction DR1 on the substrate 100 in the second region NR2. The third active pattern F3 may extend in the first horizontal direction DR1 on the substrate 100 in the third region NR3. The fourth active pattern F4 may extend in the first horizontal direction DR1 on the substrate 100 in the fourth region PR1. The fifth active pattern F5 may extend in the first horizontal direction DR1 on the substrate 100 in the fifth region PR2. The sixth active pattern F6 may extend in the first horizontal direction DR1 on the substrate 100 in the sixth region PR3.

In an embodiment, the field insulating layer 105 may then be formed on the top surface of the substrate 100. In an embodiment, the field insulating layer 105 may surround the sidewalls of the first to sixth active patterns F1 to F6. For example, the top surface of each of the first to sixth active patterns F1 to F6 may be formed higher (e.g., in the vertical direction DR3) than the top surface of the field insulating layer 105.

Thereafter, first to sixth dummy gates DG1 to DG6 may be formed. For example, the first dummy gate DG1 may extend in the second horizontal direction DR2 on (e.g., directly thereon in the third direction DR3) the first active pattern F1 and the field insulating layer 105 in the first region NR1. The second dummy gate DG2 may extend in the second horizontal direction DR2 on (e.g., directly thereon in the third direction DR3) the second active pattern F2 and the field insulating layer 105 in the second region NR2. The third dummy gate DG3 may extend in the second horizontal direction DR2 on (e.g., directly thereon in the third direction DR3) the third active pattern F3 and the field insulating layer 105 in the third region NR3. The fourth dummy gate DG4 may extend in the second horizontal direction DR2 on (e.g., directly thereon in the third direction DR3) the fourth active pattern F4 and the field insulating layer 105 in the fourth region PR1. The fifth dummy gate DG5 may extend in the second horizontal direction DR2 on (e.g., directly thereon in the third direction DR3) the fifth active pattern FS and the field insulating layer 105 in the fifth region PR2. The sixth dummy gate DG6 may extend in the second horizontal direction DR2 on (e.g., directly thereon in the third direction DR3) the sixth active pattern F6 and the field insulating layer 105 in the sixth region PR3.

In an embodiment, the first to sixth gate spacers 111 to 116 may be formed on both sidewalls of the first to sixth dummy gates DG1 to DG6 in the first horizontal direction DR1, respectively. For example, in an embodiment the first gate spacers 111 may extend in the second horizontal direction DR2 on both sidewalls of the first dummy gate DG1. The second gate spacers 112 may extend in the second horizontal direction DR2 on both sidewalls of the second dummy gate DG2. The third gate spacers 113 may extend in the second horizontal direction DR2 on both sidewalls of the third dummy gate DG3. The fourth gate spacers 114 may extend in the second horizontal direction DR2 on both sidewalls of the fourth dummy gate DG4. The fifth gate spacers 115 may extend in the second horizontal direction DR2 on both sidewalls of the fifth dummy gate DG5. The sixth gate spacers 116 may extend in the second horizontal direction DR2 on both sidewalls of the sixth dummy gate DG6.

In an embodiment, the first to sixth source/drain regions SD1 to SD6 may then be formed on at least one side of the first to sixth dummy gates DG1 to DG6, respectively. For example, in an embodiment the first source/drain region SD1 may be formed on both sides of the first dummy gate DG1 on the first active pattern F1. The second source/drain region SD2 may be formed on both sides of the second dummy gate DG2 on the second active pattern F2. The third source/drain region SD3 may be formed on both sides of the third dummy gate DG3 on the third active pattern F3. The fourth source/drain region SD4 may be formed on both sides of the fourth dummy gate DG4 on the fourth active pattern F4. The fifth source/drain region SD5 may be formed on both sides of the fifth dummy gate DGS on the fifth active pattern F5. The sixth source/drain region SD6 may be formed on both sides of the sixth dummy gate DG6 on the sixth active pattern F6.

In an embodiment, the first interlayer insulating layer 150 may then be formed on (e.g., formed directly thereon) the field insulating layer 105 and the first to sixth active patterns F1 to F6. The first interlayer insulating layer 150 may cover each of the first to sixth source/drain regions SD1 to SD6. For example, in an embodiment the top surface of the first interlayer insulating layer 150 may be formed on the same plane (e.g., in the third direction DR3) as the top surface of each of the first to sixth dummy gates DG1 to DG6.

Referring to FIGS. 13 to 16, each of the first to sixth dummy gates DG1 to DG6 may be etched. Through this etching process, a first gate trench GT1 may be formed between the first gate spacers 111 (e.g., in the first direction DR1), a second gate trench GT2 may be formed between the second gate spacers 112 (e.g., in the first direction DR1), a third gate trench GT3 may be formed between the third gate spacers 113 (e.g., in the first direction DR1), a fourth gate trench GT4 may be formed between the fourth gate spacers 114 (e.g., in the first direction DR1), a fifth gate trench GTS may be formed between the fifth gate spacers 115 (e.g., in the first direction DR1), and a sixth gate trench GT6 may be formed between the sixth gate spacers 116 (e.g., in the first direction DR1).

Figure 17:
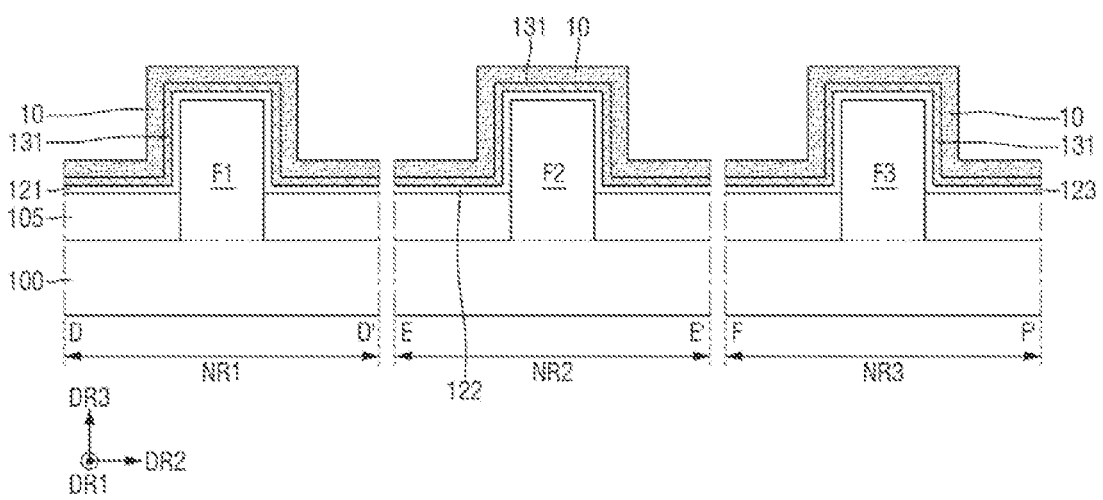
Figure 18:
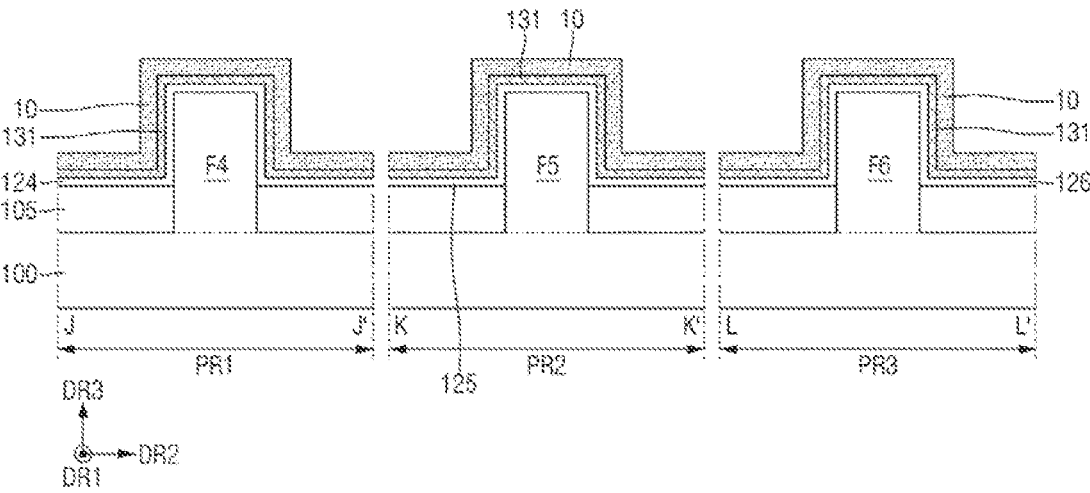

Referring to FIGS. 17 and 18, the first to sixth gate insulating layers 121 to 126 may be formed inside the first to sixth gate trenches GT1 to GT6, respectively. For example, the first gate insulating layer 121 may be formed along (e.g., directly on) the sidewall and bottom surface of the first gate trench GT1 (see FIG. 13). For example, the first gate insulating layer 121 may be formed on (e.g., directly on) the top surface of the field insulating layer 105 in the first region NR1, the exposed surface of the first active pattern F1, and the sidewall of the first gate spacer 111. The second gate insulating layer 122 may be formed along (e.g., directly on) the sidewall and bottom surface of the second gate trench GT2 (see FIG. 13). For example, the second gate insulating layer 122 may be formed on (e.g., directly on) the top surface of the field insulating layer 105 in the second region NR2, the exposed surface of the second active pattern F2, and the sidewall of the second gate spacer 112. The third gate insulating layer 123 may be formed along (e.g., directly on) the sidewall and bottom surface of the third gate trench GT3 (see FIG. 13). For example, the third gate insulating layer 123 may be formed on (e.g., directly on) the top surface of the field insulating layer 105 in the third region NR3, the exposed surface of the third active pattern F3, and the sidewall of the third gate spacer 113.

Figure 15:
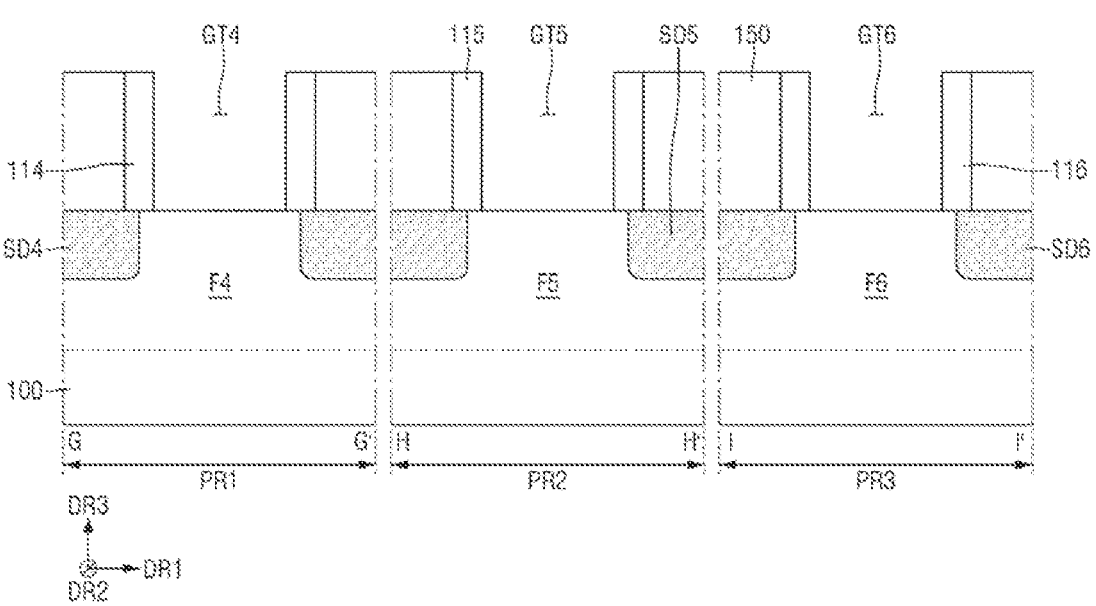
Figure 16:
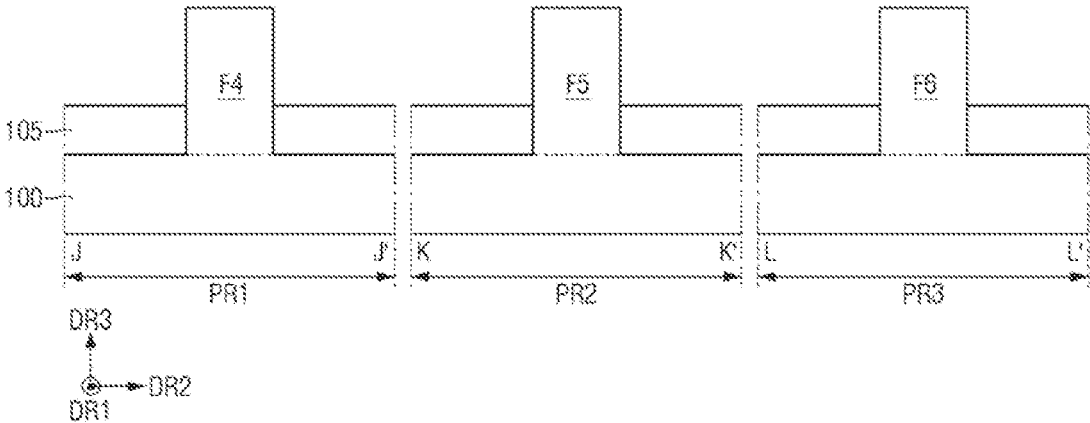

In addition, the fourth gate insulating layer 124 may be formed along (e.g., directly on) the sidewall and bottom surface of the fourth gate trench GT4 (see FIG. 15). For example, the fourth gate insulating layer 124 may be formed on (e.g., directly on) the top surface of the field insulating layer 105 in the fourth region PR1, the exposed surface of the fourth active pattern F4, and the sidewall of the fourth gate spacer 114. The fifth gate insulating layer 125 may be formed along (e.g., directly on) the sidewall and bottom surface of the fifth gate trench GT5 (see FIG. 15). For example, the fifth gate insulating layer 125 may be formed on (e.g., directly on) the top surface of the field insulating layer 105 in the fifth region PR2, the exposed surface of the fifth active pattern F5, and the sidewall of the fifth gate spacer 115. The sixth gate insulating layer 126 may be formed along (e.g., directly on) the sidewall and bottom surface of the sixth gate trench GT6 (see FIG. 15). For example, the sixth gate insulating layer 126 may be formed on (e.g., directly on) the top surface of the field insulating layer 105 in the sixth region PR3, the exposed surface of the sixth active pattern F6, and the sidewall of the sixth gate spacer 116.

In an embodiment, the first layer 131 and a first passivation layer 10 may then be sequentially formed on the first to sixth gate insulating layers 121 to 126 in the first to sixth regions NR1, NR2, NR3, PR1, PR2, and PR3. For example, the first layer 131 may be formed through the same process in the first to sixth regions NR1, NR2, NR3, PR1, PR2, and PR3. For example, the first layer 131 may be in direct contact with each of the first to sixth gate insulating layers 121 to 126. For example, the first passivation layer 10 may be in direct contact with the first layer 131. For example, each of the first layer 131 and the first passivation layer 10 may be conformally formed. However, embodiments of the present disclosure are not necessarily limited thereto. In an embodiment, the first layer 131 may include, for example, titanium nitride (TiN). The first passivation layer 10 may include a material having an etching selectivity with respect to the first layer 131. The first passivation layer 10 may include, for example, aluminum oxide ($Al_2O_3$). However, embodiments of the present disclosure are not necessarily limited thereto. For example, in some embodiments, the first passivation layer 10 may include lanthanum oxide (LaO) or titanium oxide (TiO).

Figure 19:
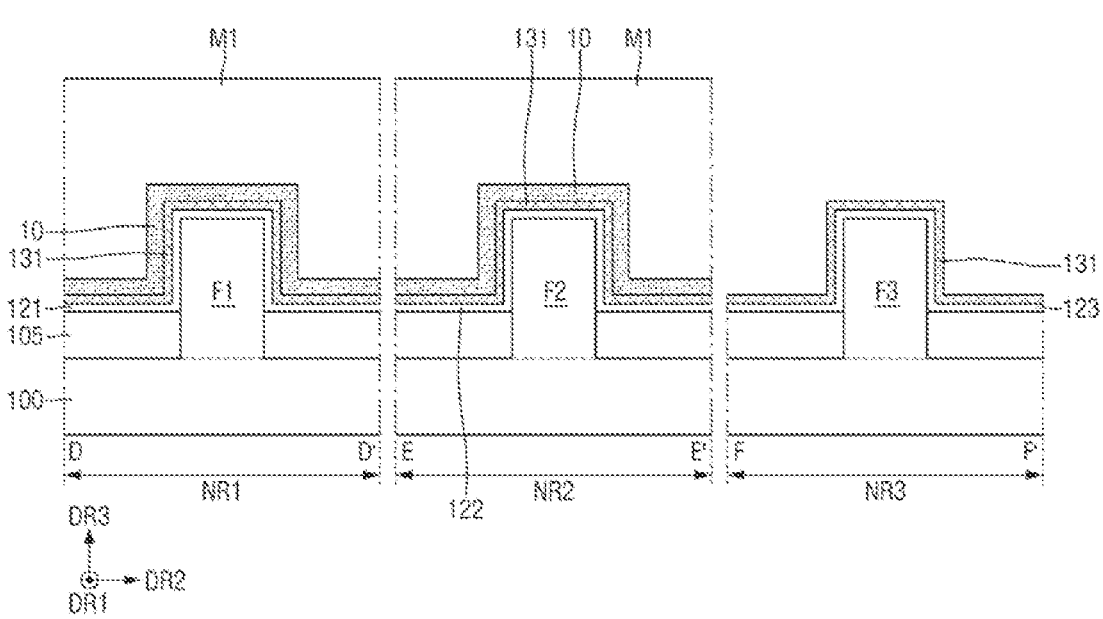
Figure 20:
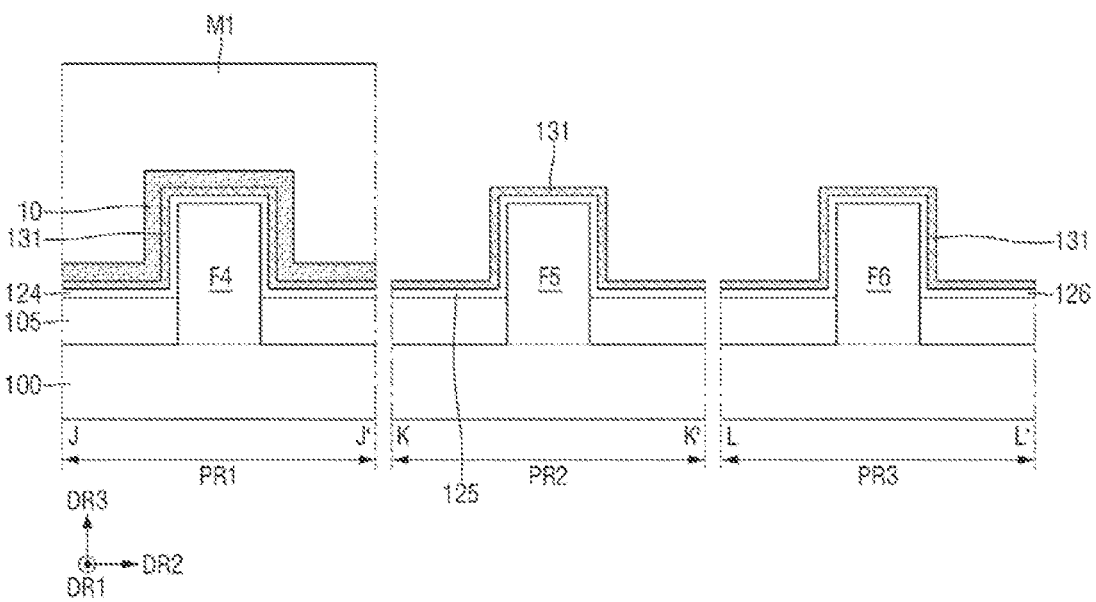

Referring to FIGS. 19 and 20, a first mask pattern M1 may be formed in each of the first region NR1, the second region NR2, and the fourth region PR1. In an embodiment, the first passivation layer 10 formed on each of the third region NR3, the fifth region PR2, and the sixth region PR3 may then be etched. For example, in an embodiment the first passivation layer 10 may be etched using a wet etching process.

Figure 21:
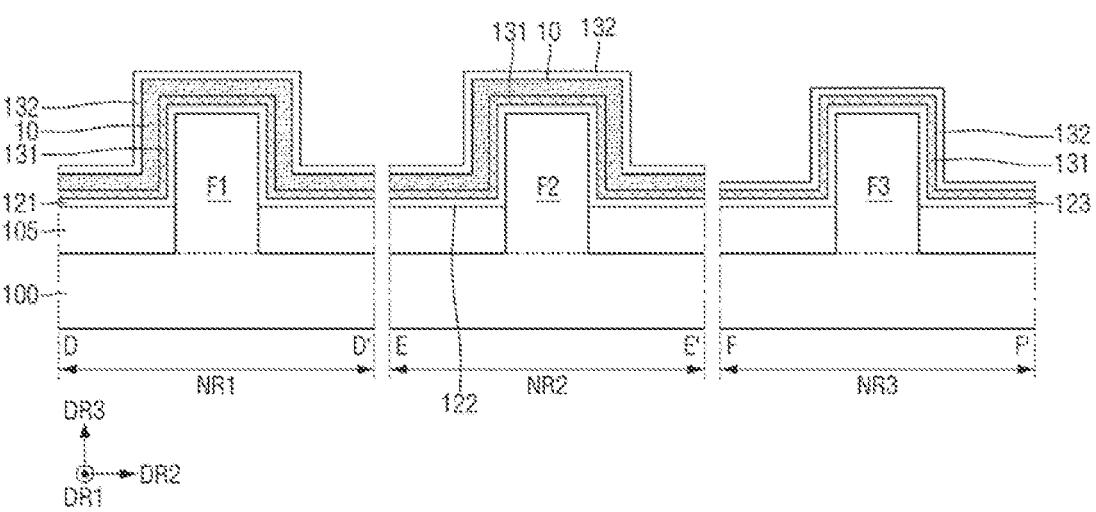
Figure 22:
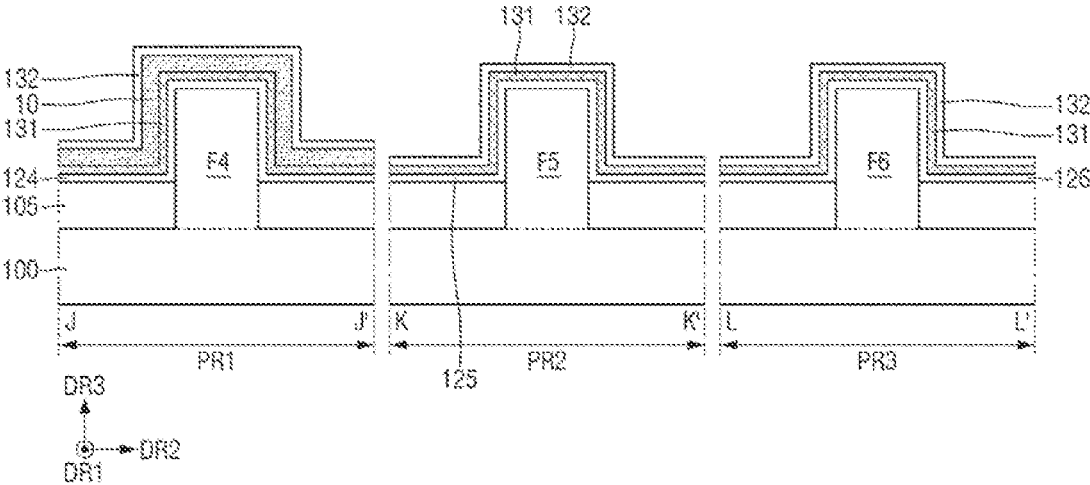

Referring to FIGS. 21 and 22, the first mask pattern M1 (see FIGS. 19 and 20) may be removed. The second layer 132 may then be formed on (e.g., directly thereon) the first passivation layer 10 in each of the first region NR1, the second region NR2, and the fourth region PR1. In addition, the second layer 132 may be formed on (e.g., directly thereon) the first layer 131 in each of the third region NR3, the fifth region PR2, and the sixth region PR3. For example, in an embodiment the second layer 132 may be conformally formed. For example, in an embodiment the second layer 132 may include the same material as the first layer 131. The second layer 132 may include, for example, titanium nitride (TiN). However, embodiments of the present disclosure are not necessarily limited thereto.

Figure 23:
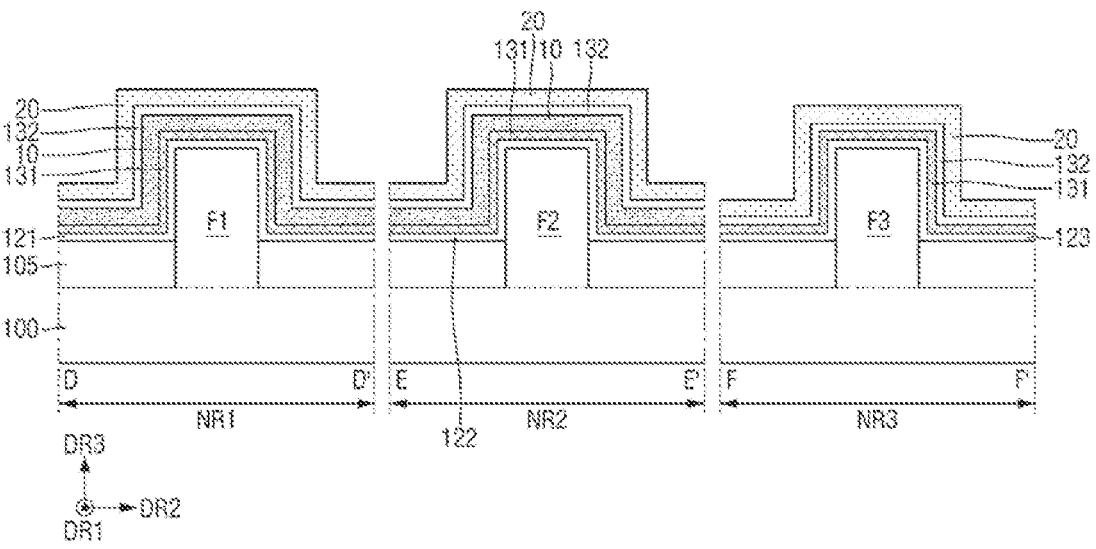
Figure 24:
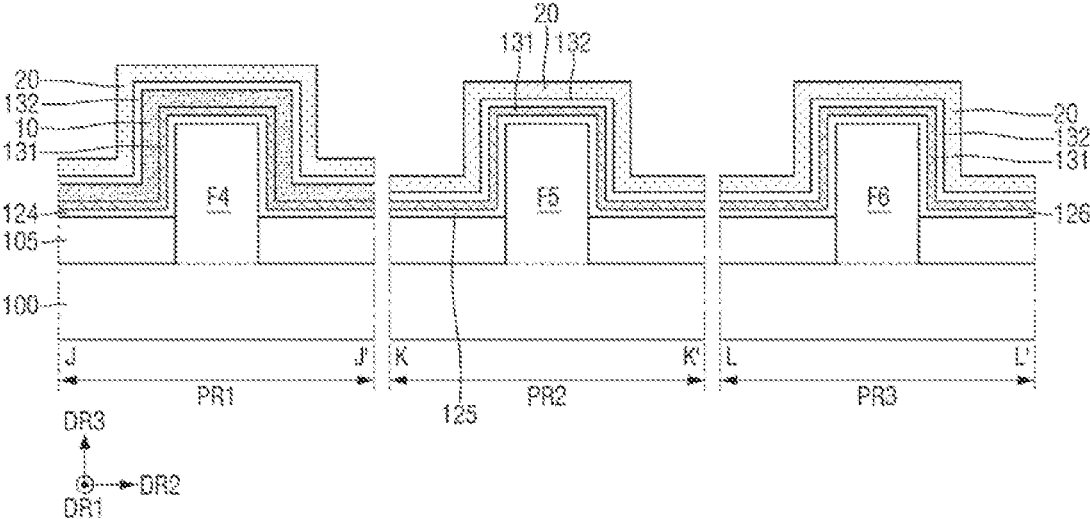

Referring to FIGS. 23 and 24, a second passivation layer 20 may be formed on (e.g., formed directly thereon) the second layer 132 in each of the first to sixth regions NR1, NR2, NR3, PR1, PR2, and PR3. For example, in an embodiment the second passivation layer 20 may be conformally formed. However, embodiments of the present disclosure are not necessarily limited thereto. The second passivation layer 20 may include a material having an etching selectivity with respect to the second layer 132. In an embodiment, the second passivation layer 20 may include, for example, aluminum oxide ($Al_2O_3$). However, embodiments of the present disclosure are not necessarily limited thereto. In some embodiments, the second passivation layer 20 may include lanthanum oxide (LaO) or titanium oxide (TiO).

Figure 25:
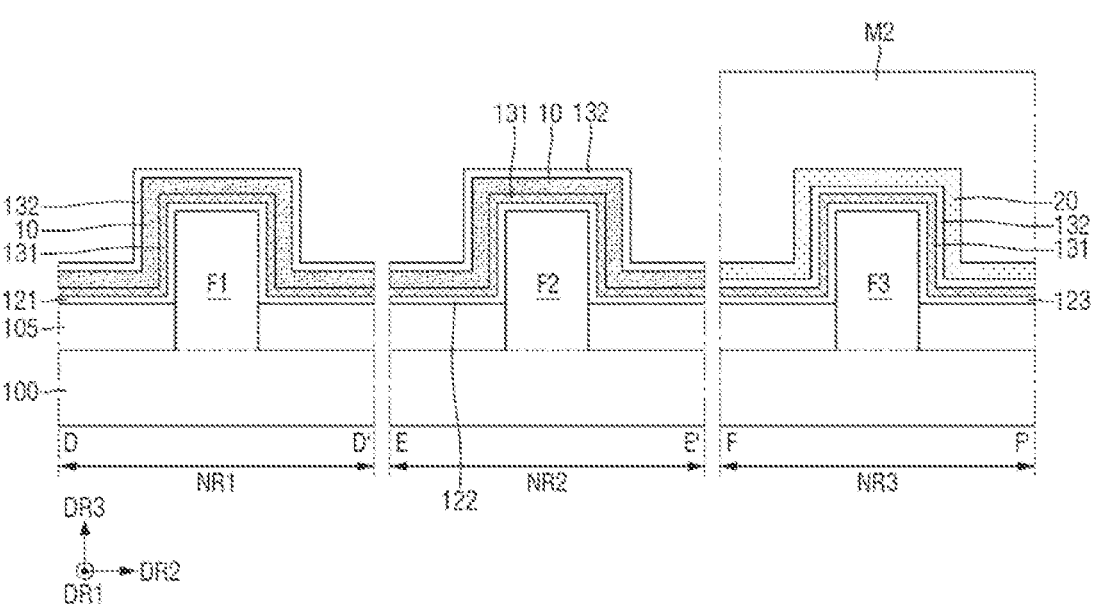
Figure 26:
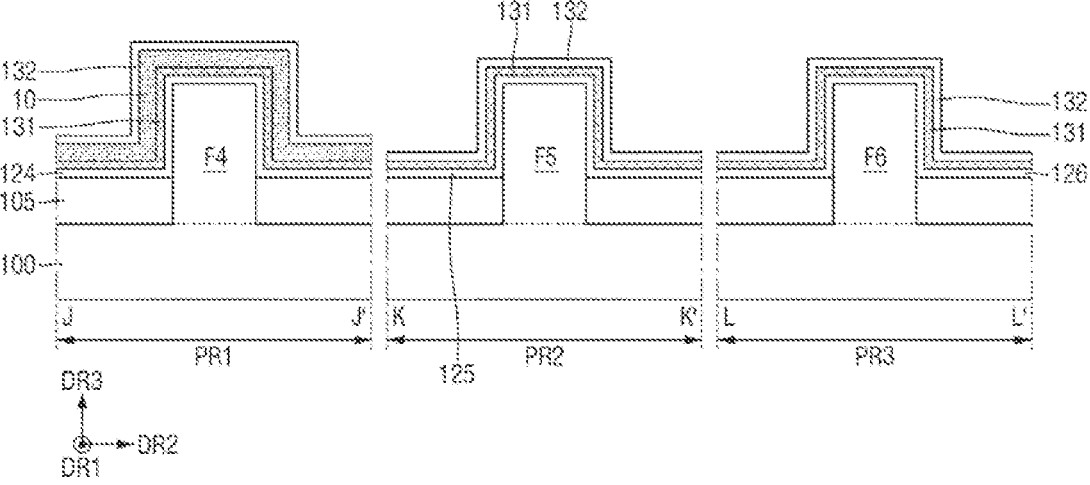

Referring to FIGS. 25 and 26, a second mask pattern M2 may be formed in the third region NR3. In an embodiment, the second passivation layer 20 formed on each of the first region NR1, the second region NR2, the fourth region PR1, the fifth region PR2, and the sixth region PR3 may then be etched. For example, in an embodiment the second passivation layer 20 may be etched using a wet etching process.

Figure 27:
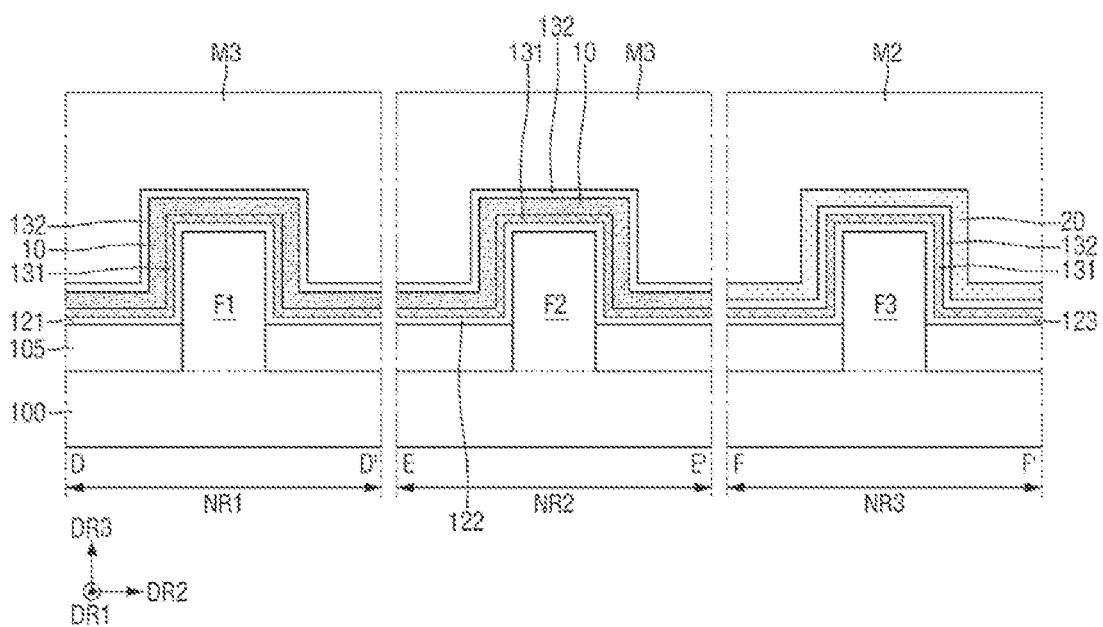
Figure 28:
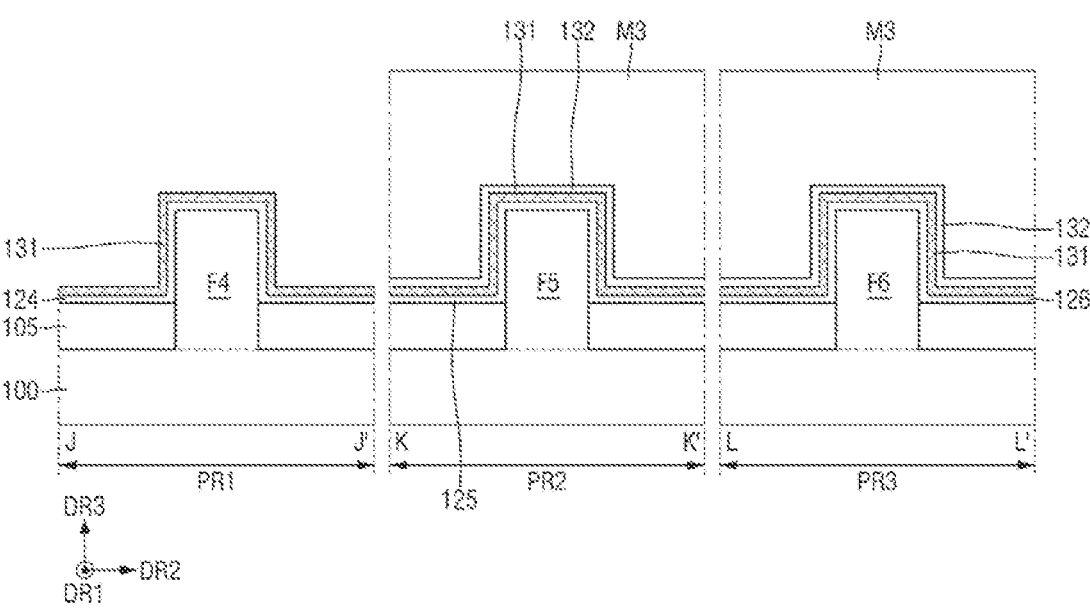

Referring to FIGS. 27 and 28, a third mask pattern M3 may be formed in each of the first region NR1, the second region NR2, the fifth region PR2, and the sixth region PR3. In an embodiment, the second layer 132 and the first passivation layer 10 formed in the fourth region PR1 may then be etched. For example, the second layer 132 formed in the fourth region PR1 and the first passivation layer 10 formed in the fourth region PR1 may be etched through different processes.

Figure 29:
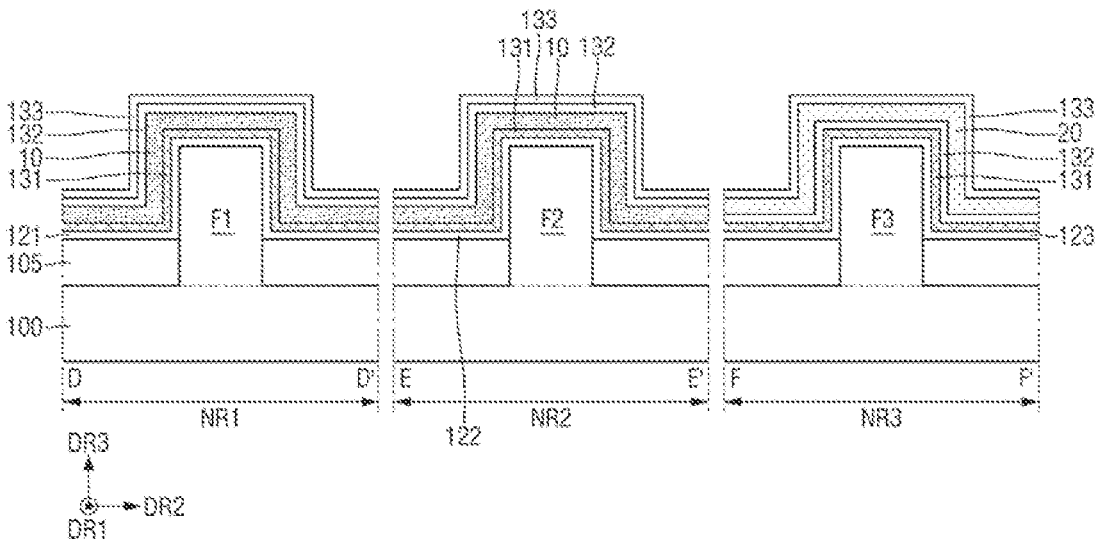
Figure 30:
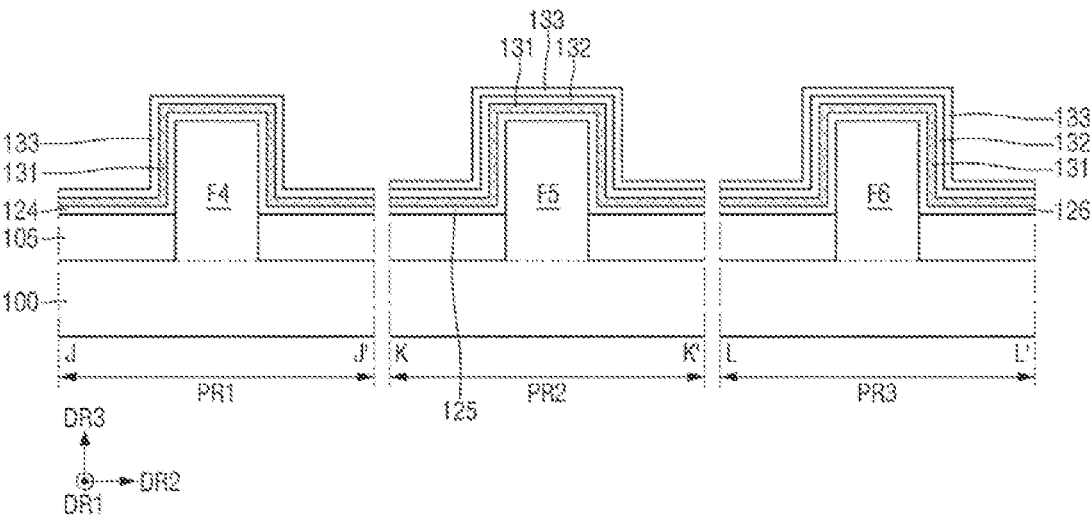

Referring to FIGS. 29 and 30, the second mask pattern M2 (see FIG. 27) and the third mask pattern M3 (see FIGS. 27 and 28) may then be removed. In an embodiment, the third layer 133 may then be formed on the second layer 132 in each of the first region NR1, the second region NR2, the fifth region PR2, and the sixth region PR3. In addition, the third layer 133 may be formed on the second passivation layer 20 in the third region NR3. In addition, the third layer 133 may be formed on the first layer 131 in the fourth region PR1. For example, the third layer 133 may be conformally formed. For example, in an embodiment the third layer 133 may include the same material as each of the first layer 131 and the second layer 132. In an embodiment, the third layer 133 may include, for example, titanium nitride (TiN). However, embodiments of the present disclosure are not necessarily limited thereto.

Figure 31:
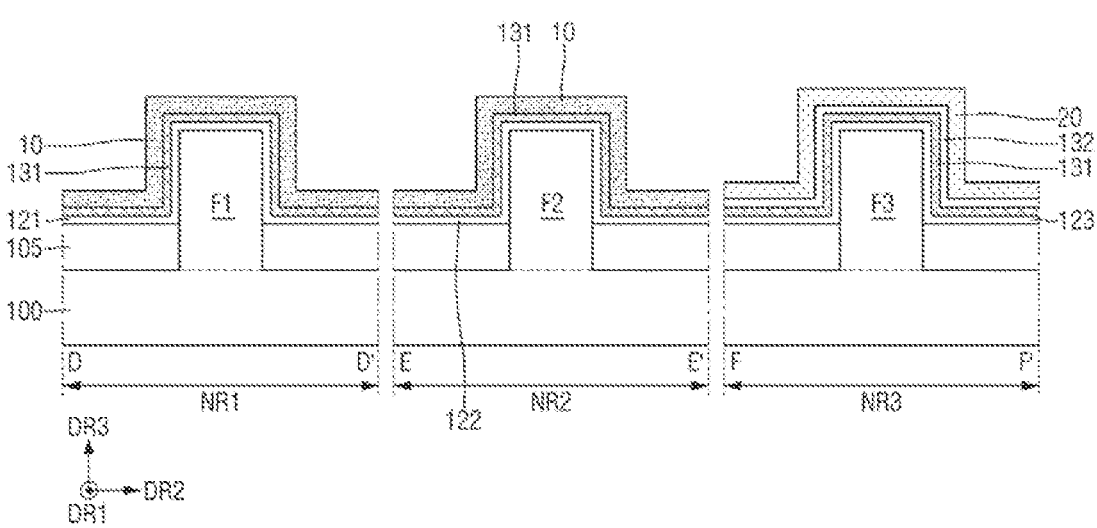
Figure 32:
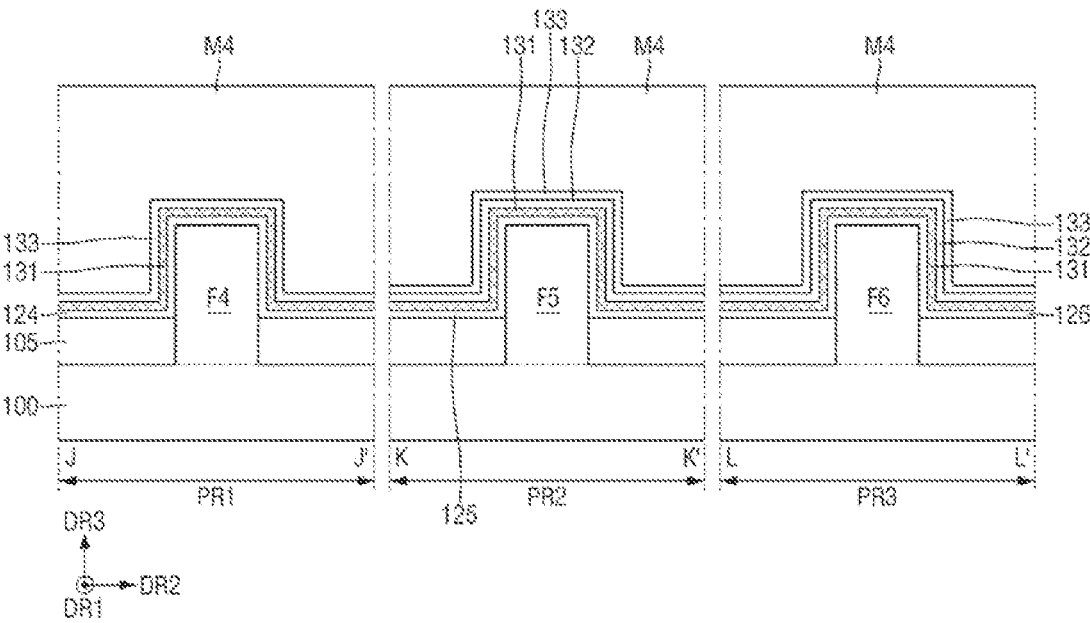

Referring to FIGS. 31 and 32, a fourth mask pattern M4 may be formed in each of the fourth region PR1, the fifth region PR2, and the sixth region PR3. In an embodiment, the third layer 133 and the second layer 132 formed in each of the first region NR1 and the second region NR2 may then be etched. In addition, the third layer 133 formed in the third region NR3 may be etched.

Figure 33:
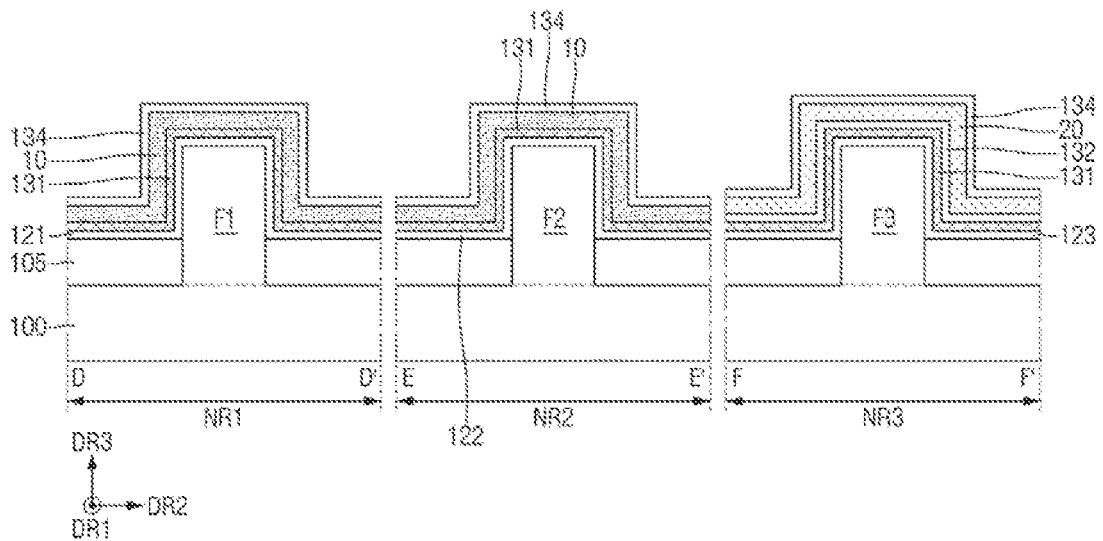
Figure 34:
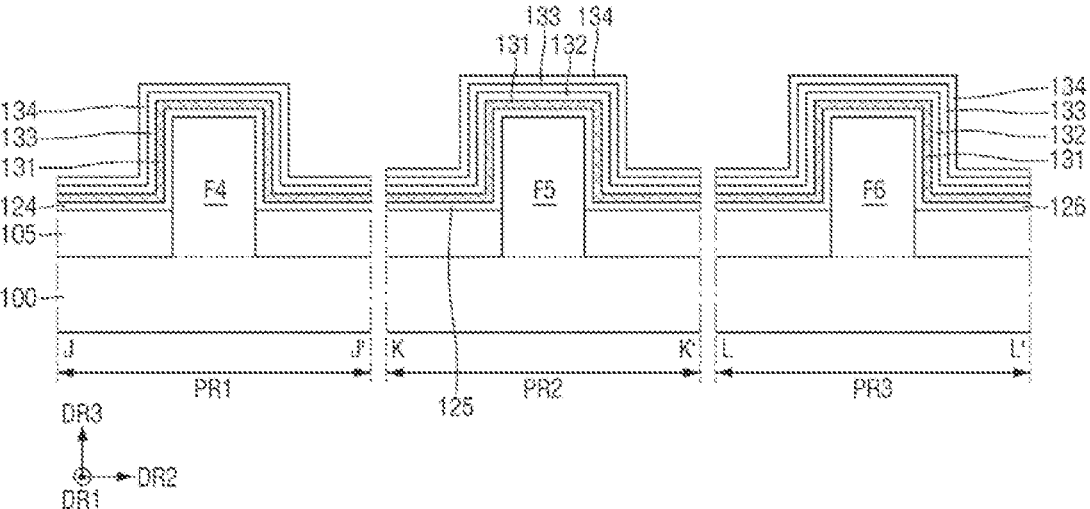

Referring to FIGS. 33 and 34, the fourth mask pattern M4 (see FIG. 32) may be removed. Thereafter, the fourth layer 134 may be formed on (e.g., directly thereon) the first passivation layer 10 in each of the first region NR1 and the second region NR2. In addition, the fourth layer 134 may be formed on (e.g., directly thereon) the second passivation layer 20 in the third region NR3. In addition, the fourth layer 134 may be formed on (e.g., directly thereon) the third layer 133 in each of the fourth region PR1, the fifth region PR2, and the sixth region PR3. For example, the fourth layer 134 may be conformally formed. For example, in an embodiment the fourth layer 134 may include the same material as each of the first layer 131, the second layer 132, and the third layer 133. In an embodiment, the fourth layer 134 may include, for example, titanium nitride (TiN). However, embodiments of the present disclosure are not necessarily limited thereto.

Figure 35:
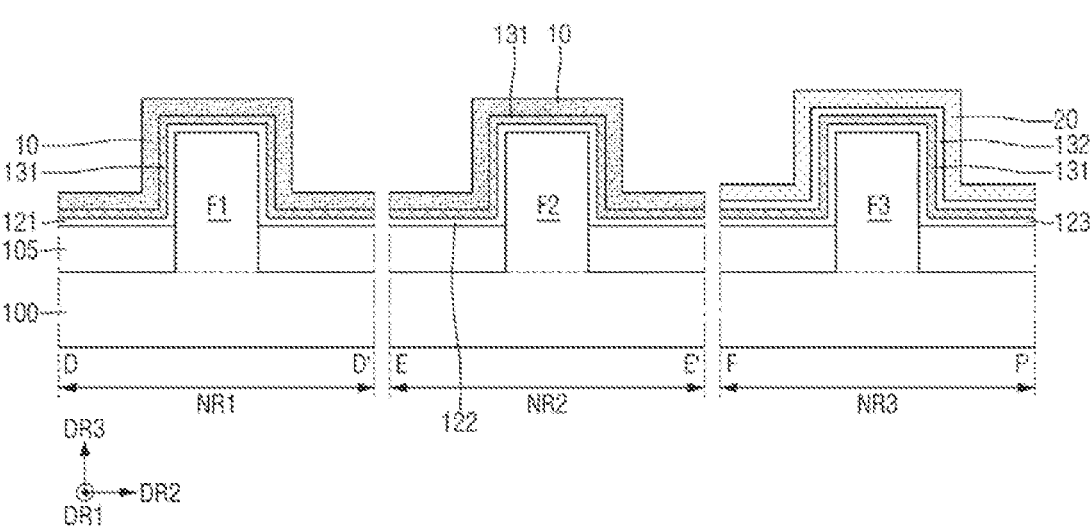
Figure 36:
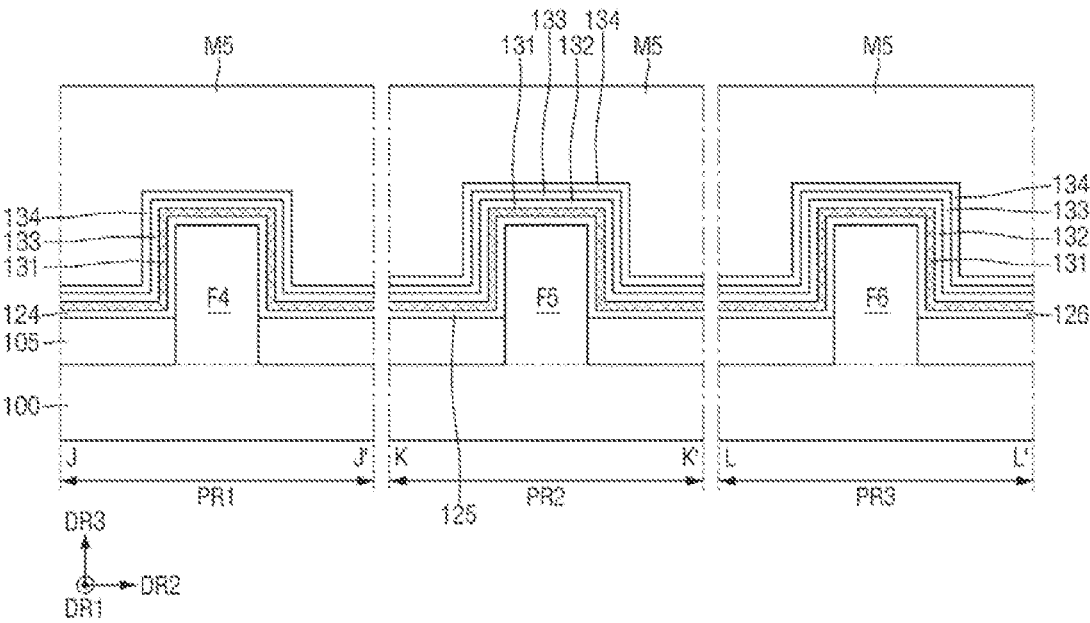

Referring to FIGS. 35 and 36, a fifth mask pattern M5 may be formed in each of the fourth region PR1, the fifth region PR2, and the sixth region PR3. In an embodiment, the fourth layer 134 formed on each of the first region NR1, the second region NR2, and the third region NR3 may then be etched.

Figure 37:
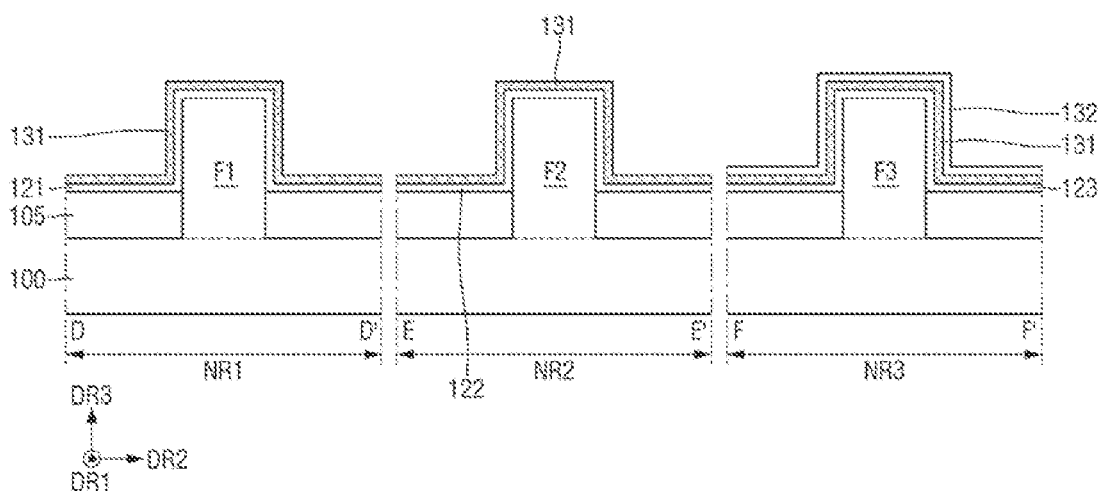
Figure 38:
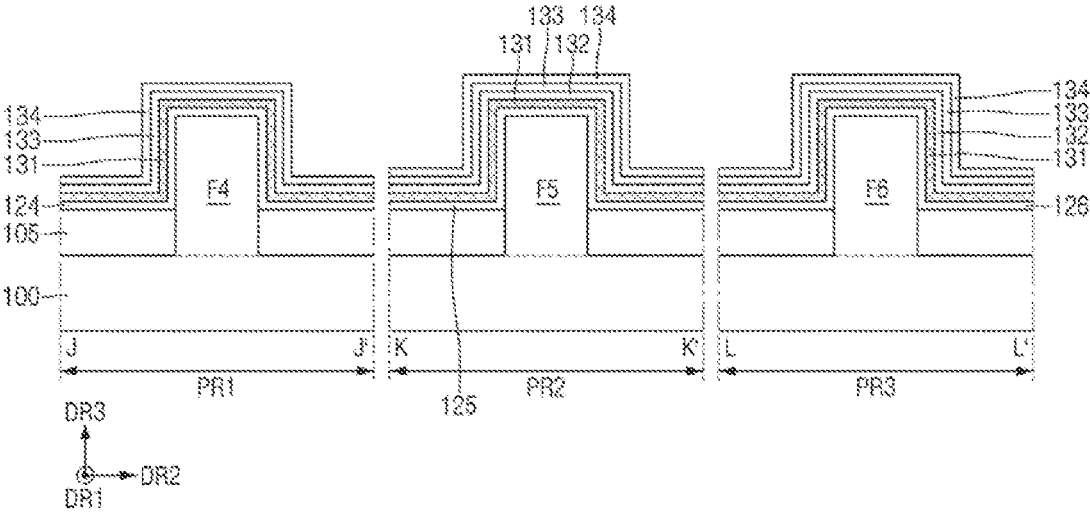

Referring to FIGS. 37 and 38, the first passivation layer 10 formed on each of the first region NR1 and the second region NR2 may be etched. In addition, the second passivation layer 20 formed in the third region NR3 may be etched. In an embodiment, the fifth mask pattern M5 (see FIG. 36) may then be removed.

Figure 39:
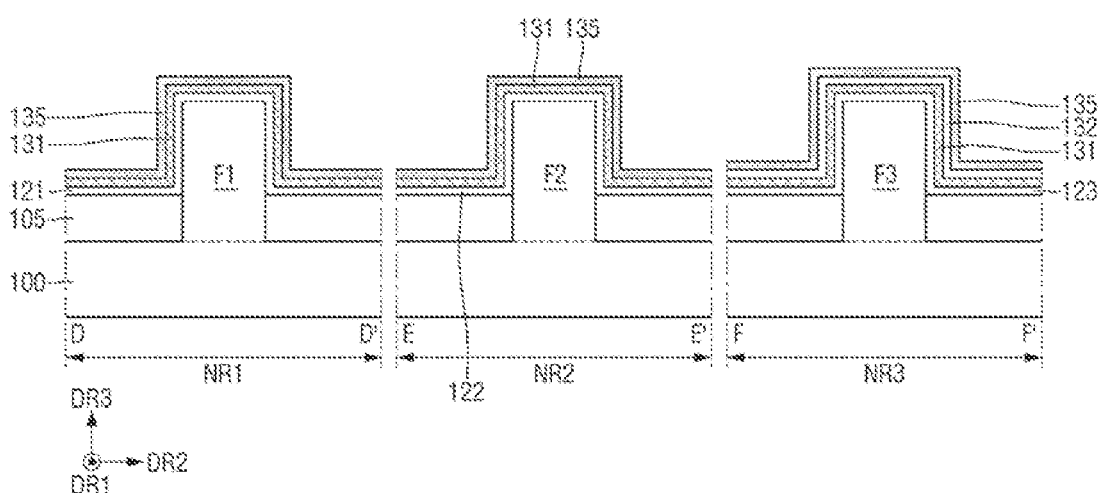
Figure 40:
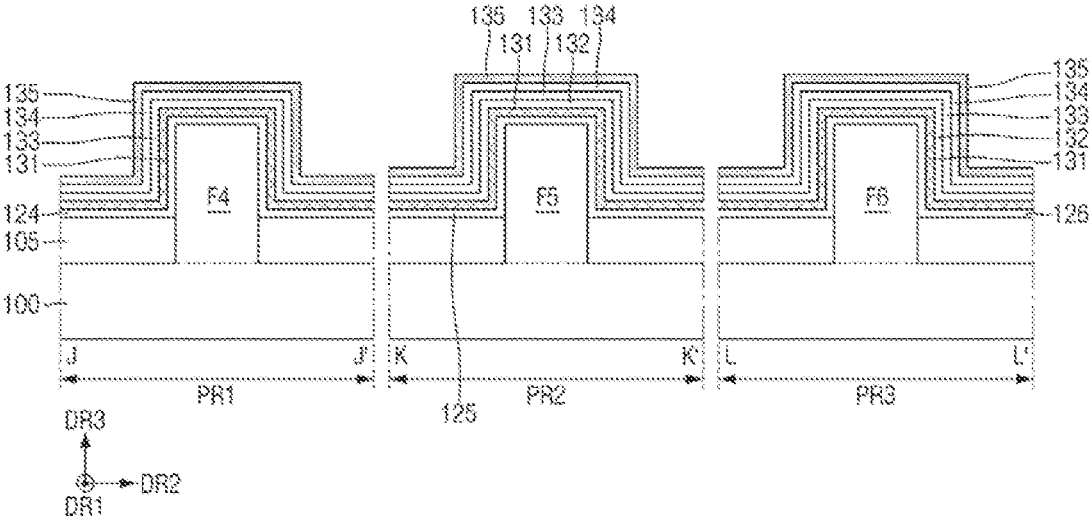

Referring to FIGS. 39 and 40, the fifth layer 135 may be formed on (e.g., directly thereon) the first layer 131 in each of the first region NR1 and the second region NR2. In addition, the fifth layer 135 may be formed on (e.g., directly thereon) the second layer 132 in the third region NR3. In addition, the fifth layer 135 may be formed on (e.g., directly thereon) the fourth layer 134 in each of the fourth region PR1, the fifth region PR2, and the sixth region PR3. For example, in an embodiment the fifth layer 135 may be conformally formed. For example, the fifth layer 135 may include a material different from each of the first to fourth layers 131, 132, 133, and 134. In an embodiment, the fifth layer 135 may include, for example, titanium aluminum carbide (TiAlC). However, embodiments of the present disclosure are not necessarily limited thereto.

Referring to FIGS. 1 to 8, the filling layer 136 may be formed on (e.g., directly thereon) the fifth layer 135 in each of the first to sixth regions NR1, NR2, NR3, PR1, PR2, and PR3. For example, on the fifth layer 135 in the first region NR1, the filling layer 136 may fill a remaining portion between the first gate spacers 111. On the fifth layer 135 in the second region NR2, the filling layer 136 may fill a remaining portion between the second gate spacers 112. On the fifth layer 135 in the third region NR3, the filling layer 136 may fill a remaining portion between the third gate spacers 113. On the fifth layer 135 in the fourth region PR1, the filling layer 136 may fill a remaining portion between the fourth gate spacers 114. On the fifth layer 135 in the fifth region PR2, the filling layer 136 may fill a remaining portion between the fifth gate spacers 115. On the fifth layer 135 in the sixth region PR3, the filling layer 136 may fill a remaining portion between the sixth gate spacers 116.

Through this process, the first gate electrode G1 including the first layer 131, the fifth layer 135, and the filling layer 136 may be formed between the first gate spacers 111 (e.g., in the first direction DR1). In addition, the second gate electrode G2 including the first layer 131, the fifth layer 135, and the filling layer 136 may be formed between the second gate spacers 112 (e.g., in the first direction DR1). In addition, the third gate electrode G3 including the first layer 131, the second layer 132, the fifth layer 135, and the filling layer 136 may be formed between the third gate spacers 113 (e.g., in the first direction DR1). In addition, the fourth gate electrode G4 including the first layer 131, the third layer 133, the fourth layer 134, the fifth layer 135, and the filling layer 136 may be formed between the fourth gate spacers 114 (e.g., in the first direction DR1). In addition, the fifth gate electrode G5 including the first layer 131, the second layer 132, the third layer 133, the fourth layer 134, the fifth layer 135, and the filling layer 136 may be formed between the fifth gate spacers 115 (e.g., in the first direction DR1). In addition, the sixth gate electrode G6 including the first layer 131, the second layer 132, the third layer 133, the fourth layer 134, the fifth layer 135, and the filling layer 136 may be formed between the sixth gate spacers 116 (e.g., in the first direction DR1).

In an embodiment, the first capping pattern 141 may then be formed on (e.g., directly thereon) the first gate spacer 111 and the first gate electrode G1. The second capping pattern 142 may be formed on (e.g., directly thereon) the second gate spacer 112 and the second gate electrode G2. The third capping pattern 143 may be formed on (e.g., directly thereon) the third gate spacer 113 and the third gate electrode G3. The fourth capping pattern 144 may be formed on (e.g., directly thereon) the fourth gate spacer 114 and the fourth gate electrode G4. The fifth capping pattern 145 may be formed on (e.g., directly thereon) the fifth gate spacer 115 and the fifth gate electrode G5. The sixth capping pattern 146 may be formed on (e.g., directly thereon) the sixth gate spacer 116 and the sixth gate electrode G6.

In an embodiment, the etch stop layer 160 and the second interlayer insulating layer 170 may then be sequentially formed on the first interlayer insulating layer 150 and the first to sixth capping patterns 141 to 146. Through this process, the semiconductor device shown in FIGS. 1 to 8 may be fabricated.

In the semiconductor device fabricating method according to some embodiments of the present disclosure, after forming the passivation layer 10 on the gate insulating layers 121 to 126, the formation and etching processes for the layers 132, 133, and 134 including titanium nitride (TiN) may be performed. In the semiconductor device fabricating method according to some embodiments of the present disclosure, while an etching process is performed on the layers 132, 133, and 134 including titanium nitride (TiN), damage to the gate insulating layers 121 to 126 may be prevented by the passivation layer 10, thereby increasing reliability of the semiconductor device.

Hereinafter, a semiconductor device fabricated by a semiconductor device fabricating method according to some embodiments of the present disclosure will be described with reference to FIGS. 41 to 44. Differences from the semiconductor device shown in FIGS. 1 to 8 will be mainly described and a repeated description of similar or identical elements may be omitted for economy of description.

Figure 41:
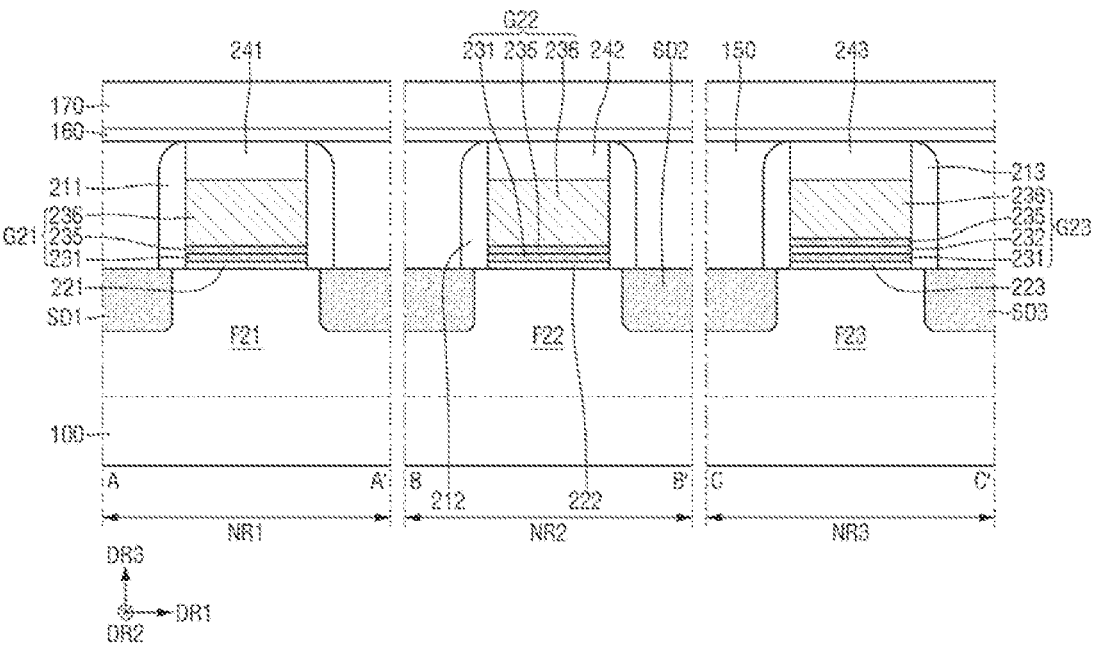
FIGS. 41 and 42 are cross-sectional views illustrating an NMOS region of a semiconductor device fabricated by a semiconductor device fabricating method according to some embodiments of the present disclosure.
Figure 42:
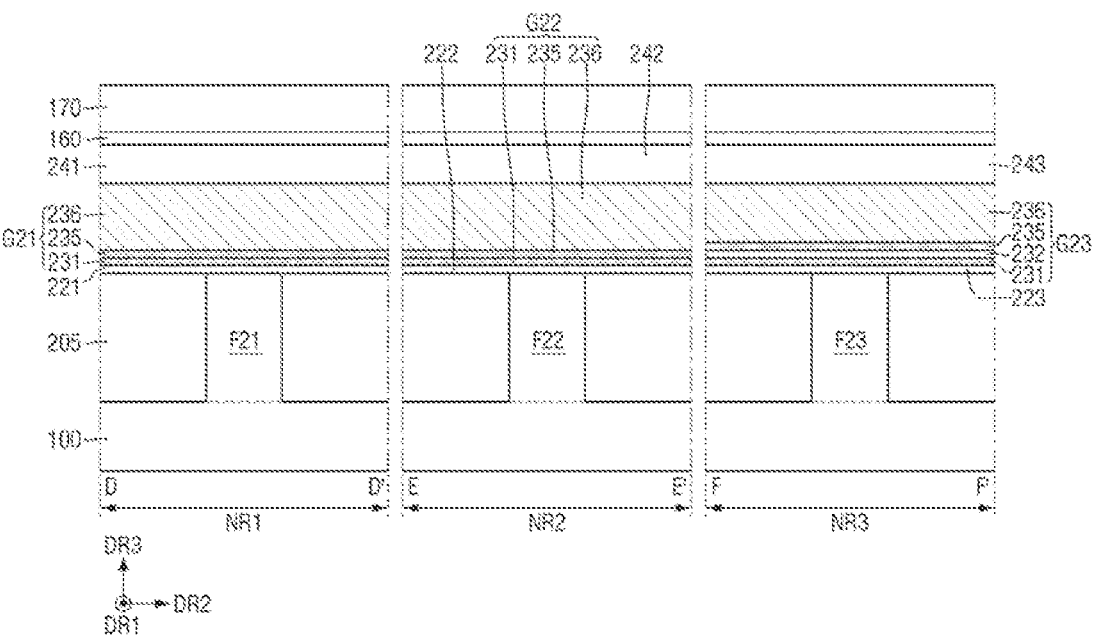
Figure 43:
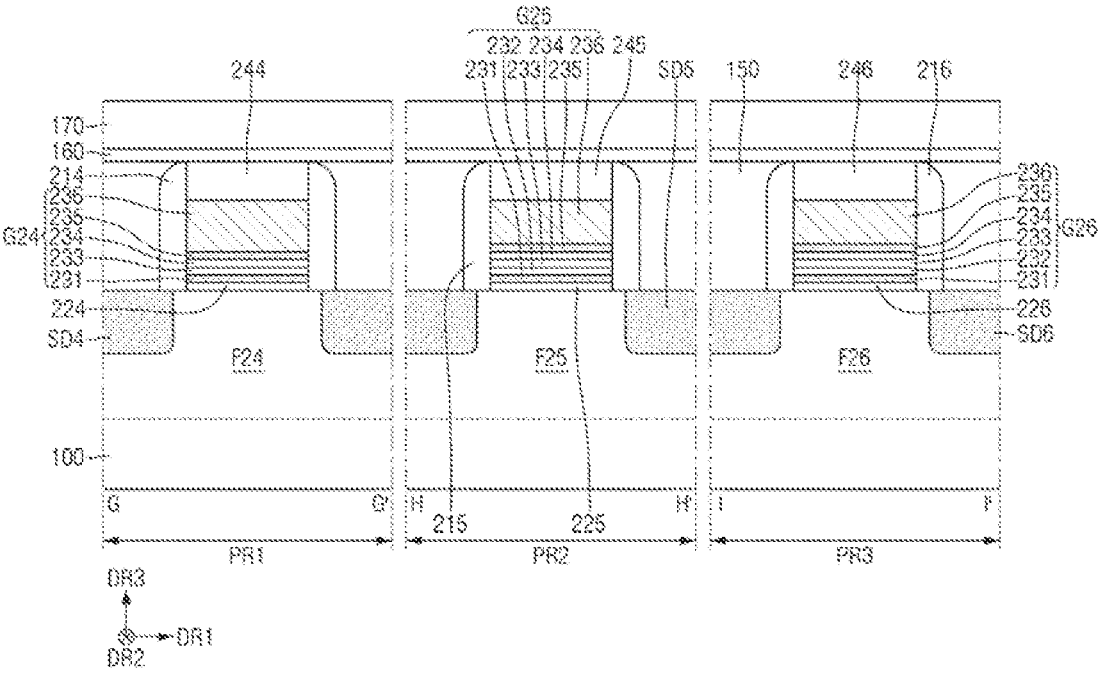
FIGS. 43 and 44 are cross-sectional views illustrating a PMOS region of a semiconductor device fabricated by a semiconductor device fabricating method according to some embodiments of the present disclosure.
Figure 44:
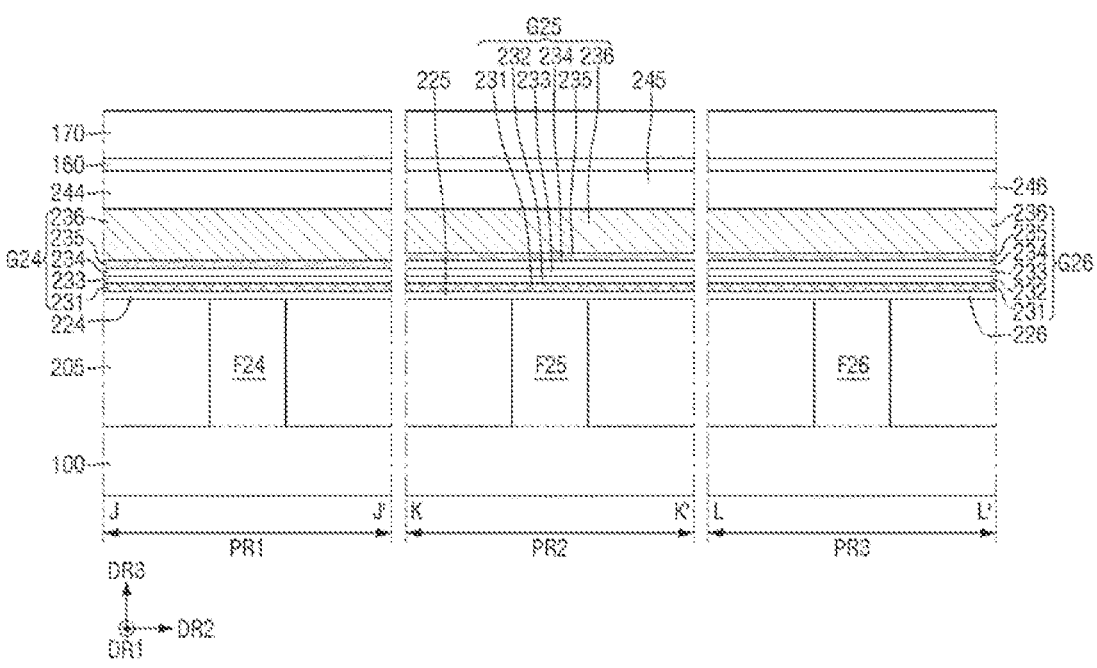

FIGS. 41 and 42 are cross-sectional views illustrating an NMOS region of a semiconductor device fabricated by a semiconductor device fabricating method according to some embodiments of the present disclosure. FIGS. 43 and 44 are cross-sectional views illustrating a PMOS region of a semiconductor device fabricated by a semiconductor device fabricating method according to some embodiments of the present disclosure.

Referring to FIGS. 41 to 44, the semiconductor device fabricated by the semiconductor device fabricating method according to some embodiments of the present disclosure may have a planar FET structure. For example, the semiconductor device fabricated by the semiconductor device fabricating method according to some embodiments of the present disclosure may include the substrate 100, a field insulating layer 205, first to sixth active patterns F21 to F26, first to sixth gate electrodes G21 to G26, first to sixth gate spacers 211 to 216, first to sixth gate insulating layers 221 to 226, first to fifth layers 231 to 235, a filling layer 236, first to sixth capping patterns 241 to 246, the first to sixth source/drain regions SD1 to SD6, the first interlayer insulating layer 150, the etch stop layer 160, and the second interlayer insulating layer 170. Hereinafter, descriptions of similar or identical components described in FIGS. 1 to 8 may be omitted for economy of description.

The first active pattern F21 may extend in the first horizontal direction DR1 in the first region NR1. The second active pattern F22 may extend in the first horizontal direction DR1 in the second region NR2. The third active pattern F23 may extend in the first horizontal direction DR1 in the third region NR3. The fourth active pattern F24 may extend in the first horizontal direction DR1 in the fourth region PR1. The fifth active pattern F25 may extend in the first horizontal direction DR1 in the fifth region PR2. The sixth active pattern F26 may extend in the first horizontal direction DR1 in the sixth region PR3. Each of the first to sixth active patterns F21 to F26 may protrude from the top surface of the substrate 100 in the vertical direction DR3.

The field insulating layer 205 may be disposed on the top surface of the substrate 100 in each of the first to sixth regions NR1, NR2, NR3, PR1, PR2, and PR3. The field insulating layer 205 may surround the sidewall of each of the first to sixth active patterns F21 to F26. For example, the top surface of each of the first to sixth active patterns F21 to F26 may be formed on the same plane (e.g., in the vertical direction DR3) as the top surface of the field insulating layer 205.

The first gate spacer 211 may extend in the second horizontal direction DR2 on (e.g., directly thereon) the field insulating layer 205 and the first active pattern F21. The second gate spacer 212 may extend in the second horizontal direction DR2 on (e.g., directly thereon) the field insulating layer 205 and the second active pattern F22. The third gate spacer 213 may extend in the second horizontal direction DR2 on (e.g., directly thereon) the field insulating layer 205 and the third active pattern F23. The fourth gate spacer 214 may extend in the second horizontal direction DR2 on (e.g., directly thereon) the field insulating layer 205 and the fourth active pattern F24. The fifth gate spacer 215 may extend in the second horizontal direction DR2 on (e.g., directly thereon) the field insulating layer 205 and the fifth active pattern F25. The sixth gate spacer 216 may extend in the second horizontal direction DR2 on (e.g., directly thereon) the field insulating layer 205 and the sixth active pattern F26.

The first gate insulating layer 221 may be disposed between the first gate spacers 211 (e.g., in the first direction DR1) along (e.g., directly on) the top surfaces of the first active pattern F21 and the field insulating layer 205. The second gate insulating layer 222 may be disposed between the second gate spacers 212 (e.g., in the first direction DR1) along (e.g., directly on) the top surfaces of the second active pattern F22 and the field insulating layer 205. The third gate insulating layer 223 may be disposed between the third gate spacers 213 (e.g., in the first direction DR1) along (e.g., directly on) the top surfaces of the third active pattern F23 and the field insulating layer 205. The fourth gate insulating layer 224 may be disposed between the fourth gate spacers 214 (e.g., in the first direction DR1) along (e.g., directly on) the top surfaces of the fourth active pattern F24 and the field insulating layer 205. The fifth gate insulating layer 225 may be disposed between the fifth gate spacers 215 (e.g., in the first direction DR1) along (e.g., directly on) the top surfaces of the fifth active pattern F25 and the field insulating layer 205. The sixth gate insulating layer 226 may be disposed between the sixth gate spacers 216 (e.g., in the first direction DR1) along (e.g., directly on) the top surfaces of the sixth active pattern F26 and the field insulating layer 205.

The first gate electrode G21 may be disposed on (e.g., directly thereon) the first gate insulating layer 221 between the first gate spacers 211 (e.g., in the first direction DR1). The first gate electrode G21 may include the first layer 231, the fifth layer 235, and the filling layer 236 sequentially stacked on the first gate insulating layer 221 (e.g., in the third direction DR3). The sidewall of each of the first layer 231, the fifth layer 235, and the filling layer 236 included in the first gate electrode G21 may be in direct contact with the first gate spacer 211. The second gate electrode G22 may be disposed on (e.g., directly thereon) the second gate insulating layer 222 between the second gate spacers 212 (e.g., in the first direction DR1). The second gate electrode G22 may include the first layer 231, the fifth layer 235, and the filling layer 236 sequentially stacked on the second gate insulating layer 222 (e.g., in the third direction DR3). The sidewall of each of the first layer 231, the fifth layer 235, and the filling layer 236 included in the second gate electrode G22 may be in direct contact with the second gate spacer 212.

The third gate electrode G23 may be disposed on (e.g., directly thereon) the third gate insulating layer 223 between the third gate spacers 213 (e.g., in the first direction DR1). The third gate electrode G23 may include the first layer 231, the second layer 232, the fifth layer 235, and the filling layer 236 sequentially stacked on the third gate insulating layer 223 (e.g., in the third direction DR3). The sidewall of each of the first layer 231, the second layer 232, the fifth layer 235, and the filling layer 236 included in the third gate electrode G23 may be in direct contact with the third gate spacer 213. The fourth gate electrode G24 may be disposed on (e.g., directly thereon) the fourth gate insulating layer 224 between the fourth gate spacers 214 (e.g., in the first direction DR1). The fourth gate electrode G24 may include the first layer 231, the third layer 233, the fourth layer 234, the fifth layer 235, and the filling layer 236 sequentially stacked on the fourth gate insulating layer 224 (e.g., in the third direction DR3). The sidewall of each of the first layer 231, the third layer 233, the fourth layer 234, the fifth layer 235, and the filling layer 236 included in the fourth gate electrode G24 may be in direct contact with the fourth gate spacer 214.

The fifth gate electrode G25 may be disposed on (e.g., directly thereon) the fifth gate insulating layer 225 between the fifth gate spacers 215 (e.g., in the first direction DR1). The fifth gate electrode G25 may include the first layer 231, the second layer 232, the third layer 233, the fourth layer 234, the fifth layer 235, and the filling layer 236 sequentially stacked on the fifth gate insulating layer 225 (e.g., in the third direction DR3). The sidewall of each of the first layer 231, the second layer 232, the third layer 233, the fourth layer 234, the fifth layer 235, and the filling layer 236 included in the fifth gate electrode G25 may be in direct contact with the fifth gate spacer 215. The sixth gate electrode G26 may be disposed on (e.g., directly thereon) the sixth gate insulating layer 226 between the sixth gate spacers 216 (e.g., in the first direction DR1). The sixth gate electrode G26 may include the first layer 231, the second layer 232, the third layer 233, the fourth layer 234, the fifth layer 235, and the filling layer 236 sequentially stacked on the sixth gate insulating layer 226 (e.g., in the third direction DR3). The sidewall of each of the first layer 231, the second layer 232, the third layer 233, the fourth layer 234, the fifth layer 235, and the filling layer 236 included in the sixth gate electrode G26 may be in direct contact with the sixth gate spacer 216.

The first capping pattern 241 may be disposed on (e.g., disposed directly thereon) the filling layer 236 between the first gate spacers 211 (e.g., in the first direction DR1). The sidewall of the first capping pattern 241 may be in direct contact with the first gate spacer 211, such as inner sidewalls of the first gate spacer 211. The second capping pattern 242 may be disposed on (e.g., disposed directly thereon) the filling layer 236 between the second gate spacers 212 (e.g., in the first direction DR1). The sidewall of the second capping pattern 242 may be in direct contact with the second gate spacer 212, such as inner sidewalls of the second gate spacer 212. The third capping pattern 243 may be disposed on (e.g., disposed directly thereon) the filling layer 236 between the third gate spacers 213 (e.g., in the first direction DR1). The sidewall of the third capping pattern 243 may be in direct contact with the third gate spacer 213, such as inner sidewalls of the third gate spacer 213. The fourth capping pattern 244 may be disposed on (e.g., disposed directly thereon) the filling layer 236 between the fourth gate spacers 214 (e.g., in the first direction DR1). The sidewall of the fourth capping pattern 244 may be in direct contact with the fourth gate spacer 214, such as inner sidewalls of the fourth gate spacer 214. The fifth capping pattern 245 may be disposed on (e.g., disposed directly thereon) the filling layer 236 between the fifth gate spacers 215 (e.g., in the first direction DR1). The sidewall of the fifth capping pattern 245 may be in direct contact with the fifth gate spacer 215, such as inner sidewalls of the fifth gate spacer 215. The sixth capping pattern 246 may be disposed on (e.g., disposed directly thereon) the filling layer 236 between the sixth gate spacers 216 (e.g., in the first direction DR1). The sidewall of the sixth capping pattern 246 may be in direct contact with the sixth gate spacer 216, such as inner sidewalls of the sixth gate spacer 216.

Hereinafter, a method for fabricating a semiconductor device according to some embodiments of the present disclosure will be described with reference to FIGS. 41 to 52. The description will focus on differences from the method of fabricating the semiconductor device illustrated in FIGS. 9 to 40 and a repeated description of similar or identical elements may be omitted for economy of description.

FIGS. 45 to 52 are diagrams illustrating intermediate steps of a method for fabricating a semiconductor device according to some embodiments of the present disclosure.

Figure 45:
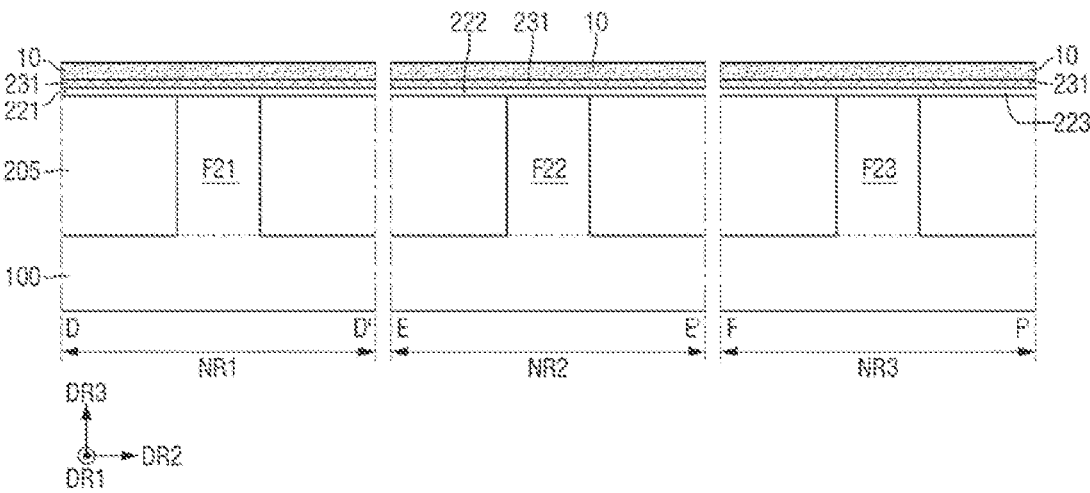
FIGS. 45 to 52 are diagrams illustrating intermediate steps of a method for fabricating a semiconductor device according to some embodiments of the present disclosure.
Figure 46:
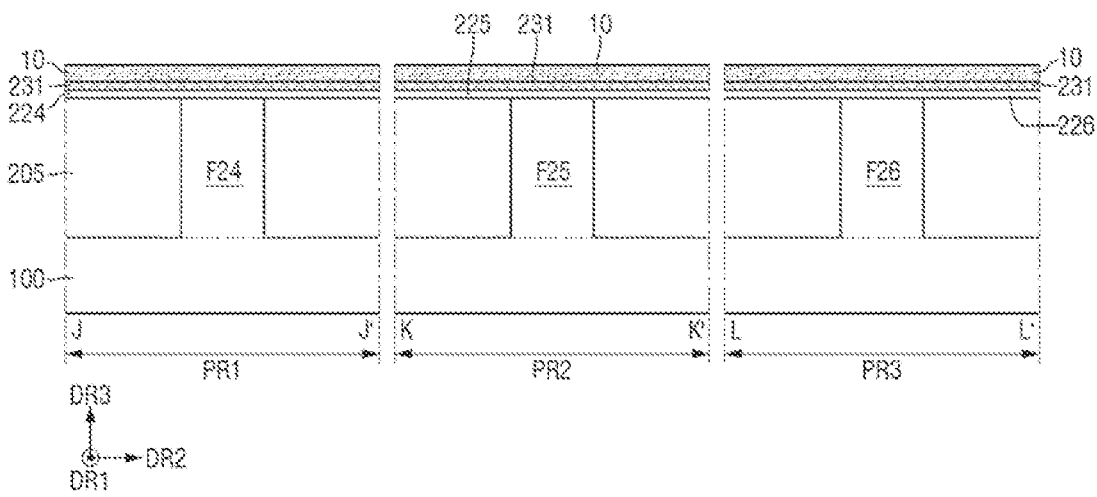
Figure 47:
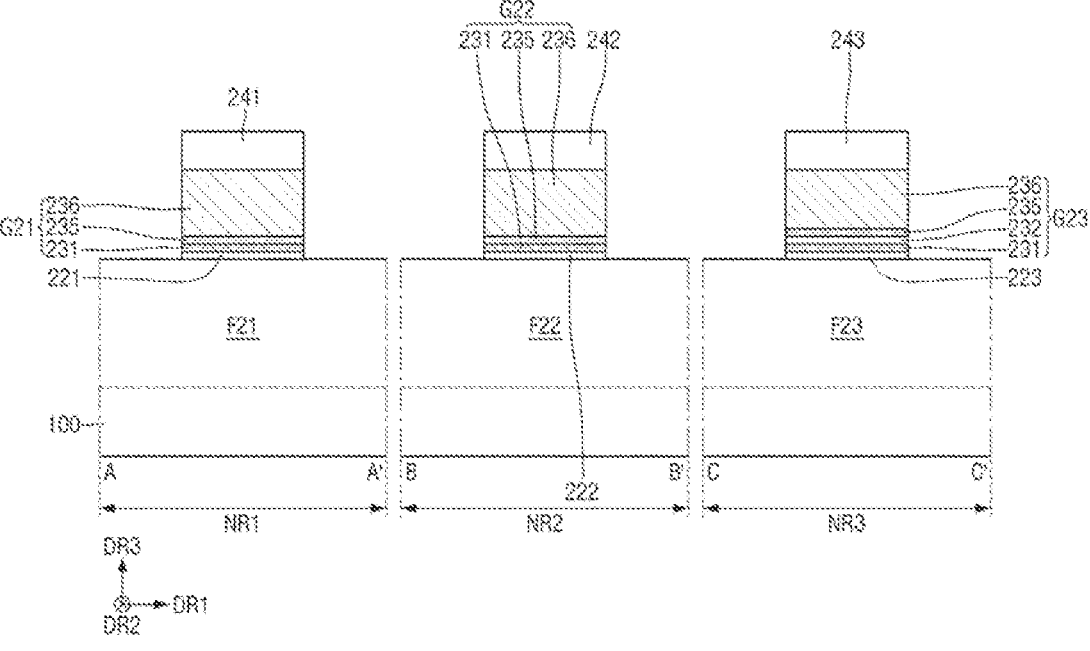
Figure 48:
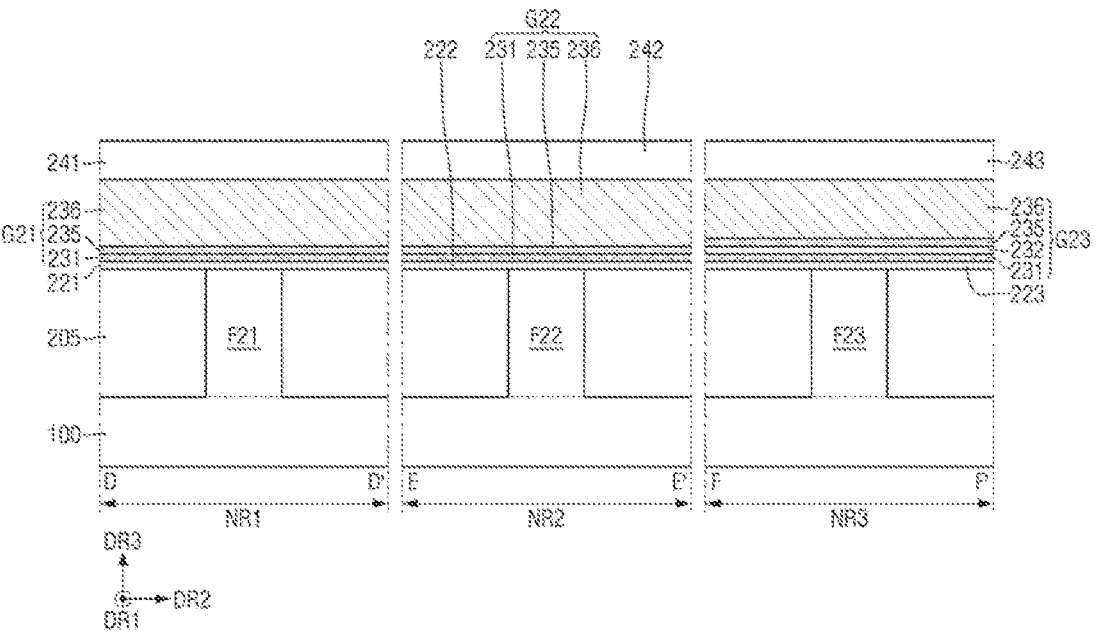
Figure 49:
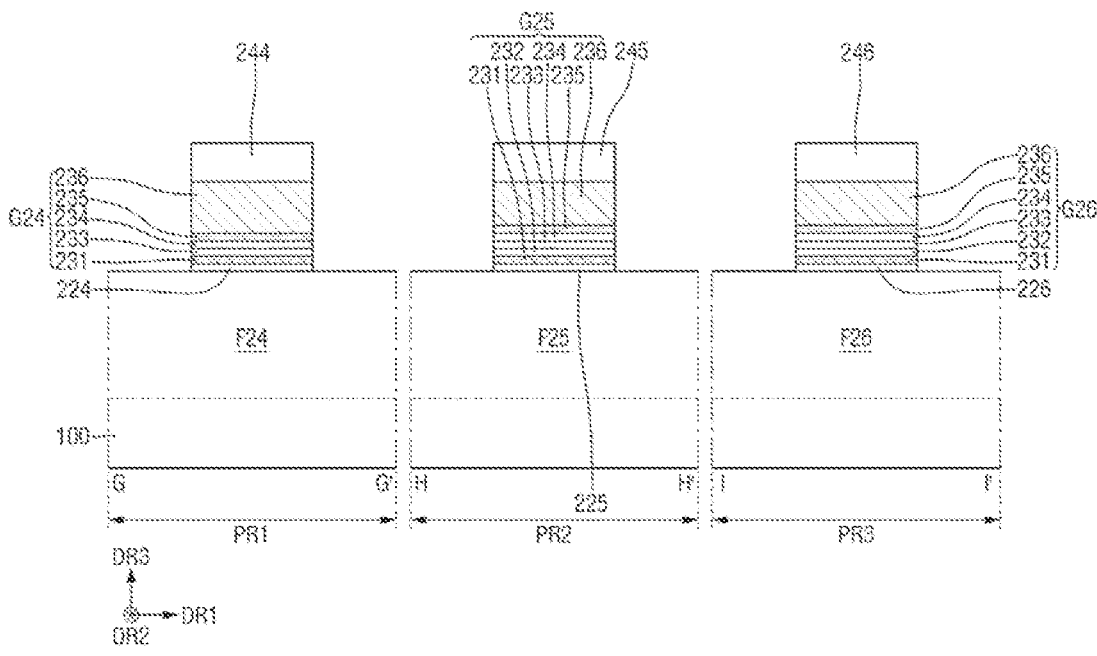
Figure 50:
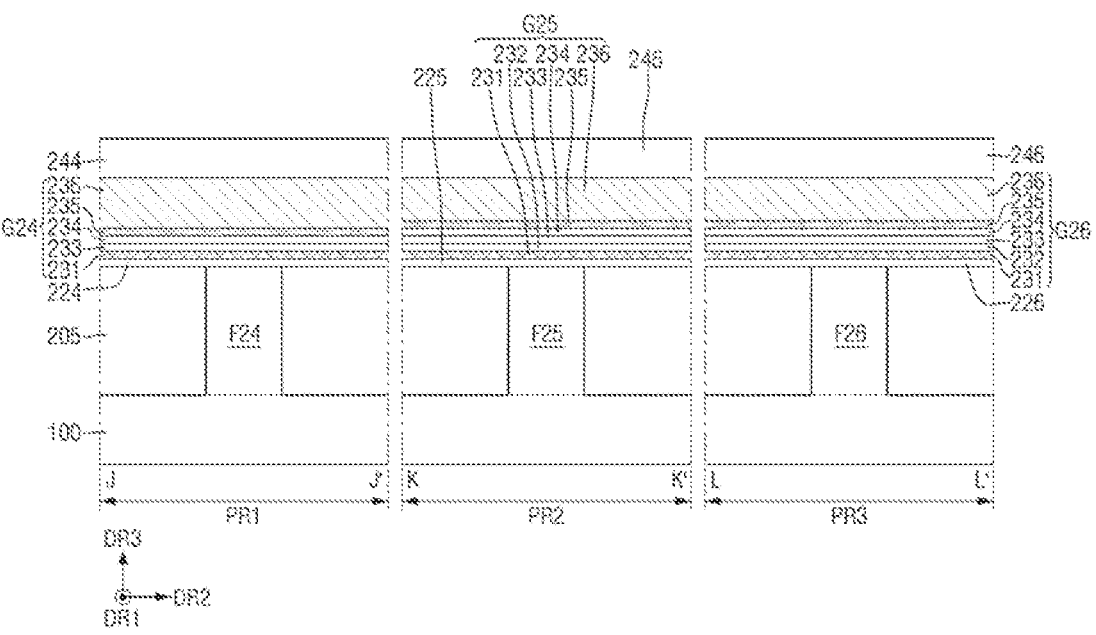

Referring to FIGS. 45 and 46, the substrate 100 on which first to sixth regions NR1, NR2, NR3, PR1, PR2, and PR3 are defined may be provided. For example, in an embodiment each of the first to third regions NR1, NR2, and NR3 may be an NMOS region. Each of the fourth to sixth regions PR1, PR2, and PR3 may be a PMOS region.

In an embodiment, the substrate 100 may then be partially etched to form the first to sixth active patterns F21 to F26. Each of the first to sixth active patterns F21 to F26 may protrude from the remaining top surface of the substrate 100 in the vertical direction DR3. For example, the first active pattern F21 may extend in the first horizontal direction DR1 on the substrate 100 in the first region NR1. The second active pattern F22 may extend in the first horizontal direction DR1 on the substrate 100 in the second region NR2. The third active pattern F23 may extend in the first horizontal direction DR1 on the substrate 100 in the third region NR3. The fourth active pattern F24 may extend in the first horizontal direction DR1 on the substrate 100 in the fourth region PR1. The fifth active pattern F25 may extend in the first horizontal direction DR1 on the substrate 100 in the fifth region PR2. The sixth active pattern F26 may extend in the first horizontal direction DR1 on the substrate 100 in the sixth region PR3.

Subsequently, the field insulating layer 205 may be formed on (e.g., directly thereon) the top surface of the substrate 100. The field insulating layer 205 may surround the sidewall of each of the first to sixth active patterns F21 to F26. For example, the top surface of each of the first to sixth active patterns F21 to F26 may be formed on the same plane (e.g., in the third direction DR3) as the top surface of the field insulating layer 205.

In an embodiment, a gate insulating material layer may then be formed on the top surfaces of the field insulating layer 205 and the first to sixth active patterns F21 to F26. The gate insulating material layer may include the first to sixth gate insulating layers 221 to 226. Thereafter, the first layer 231 and the first passivation layer 10 may be sequentially formed on the gate insulating material layer.

Referring to FIGS. 47 to 50, the processes shown in FIGS. 19 to 40 may be performed after the process shown in FIGS. 45 and 46 is performed. In an embodiment, the filling layer 236 and a capping pattern material layer may then be sequentially formed on the fifth layer 235 in each of the first to sixth regions NR1, NR2, NR3, PR1, PR2, and PR3. The capping pattern material layer may include the first to sixth capping patterns 241 to 246.

In an embodiment, a patterning process may then be performed. After the patterning process is performed, a first structure including the first gate insulating layer 221, the first gate electrode G21, and the first capping pattern 241 sequentially stacked in the first region NR1 (e.g., in the vertical direction DR3) may be formed. In an embodiment, each of the first gate insulating layer 221, the first gate electrode G21, and the first capping pattern 241 may extend in the second horizontal direction DR2. The first gate electrode G21 may include the first layer 231, the fifth layer 235, and the filling layer 236 sequentially stacked on the first gate insulating layer 221 (e.g., in the vertical direction DR3).

After the patterning process is performed, a second structure including the second gate insulating layer 222, the second gate electrode G22, and the second capping pattern 242 sequentially stacked in the second region NR2 (e.g., in the vertical direction DR3) may be formed. Each of the second gate insulating layer 222, the second gate electrode G22, and the second capping pattern 242 may extend in the second horizontal direction DR2. The second gate electrode G22 may include the first layer 231, the fifth layer 235, and the filling layer 236 sequentially stacked on the second gate insulating layer 222 (e.g., in the vertical direction DR3).

After the patterning process is performed, a third structure including the third gate insulating layer 223, the third gate electrode G23, and the third capping pattern 243 sequentially stacked in the third region NR3 (e.g., in the vertical direction DR3) may be formed. Each of the third gate insulating layer 223, the third gate electrode G23, and the third capping pattern 243 may extend in the second horizontal direction DR2. The third gate electrode G23 may include the first layer 231, the second layer 232, the fifth layer 235, and the filling layer 236 sequentially stacked on the third gate insulating layer 223 (e.g., in the vertical direction DR3).

After the patterning process is performed, a fourth structure including the fourth gate insulating layer 224, the fourth gate electrode G24, and the fourth capping pattern 244 sequentially stacked in the fourth region PR1 (e.g., in the vertical direction DR3) may be formed. Each of the fourth gate insulating layer 224, the fourth gate electrode G24, and the fourth capping pattern 244 may extend in the second horizontal direction DR2. The fourth gate electrode G24 may include the first layer 231, the third layer 233, the fourth layer 234, the fifth layer 235, and the filling layer 236 sequentially stacked on the fourth gate insulating layer 224 (e.g., in the vertical direction DR3).

After the patterning process is performed, a fifth structure including the fifth gate insulating layer 225, the fifth gate electrode G25, and the fifth capping pattern 245 sequentially stacked in the fifth region PR2 (e.g., in the vertical direction DR3) may be formed. Each of the fifth gate insulating layer 225, the fifth gate electrode G25, and the fifth capping pattern 245 may extend in the second horizontal direction DR2. The fifth gate electrode G25 may include the first layer 231, the second layer 232, the third layer 233, the fourth layer 234, the fifth layer 235, and the filling layer 236 sequentially stacked on the fifth gate insulating layer 225 (e.g., in the vertical direction DR3).

After the patterning process is performed, a sixth structure including the sixth gate insulating layer 226, the sixth gate electrode G26, and the sixth capping pattern 246 sequentially stacked in the sixth region PR3 (e.g., in the vertical direction DR3) may be formed Each of the sixth gate insulating layer 226, the sixth gate electrode G26, and the sixth capping pattern 246 may extend in the second horizontal direction DR2. The sixth gate electrode G26 may include the first layer 231, the second layer 232, the third layer 233, the fourth layer 234, the fifth layer 235, and the filling layer 236 sequentially stacked on the sixth gate insulating layer 226 (e.g., in the vertical direction DR3).

Figure 51:
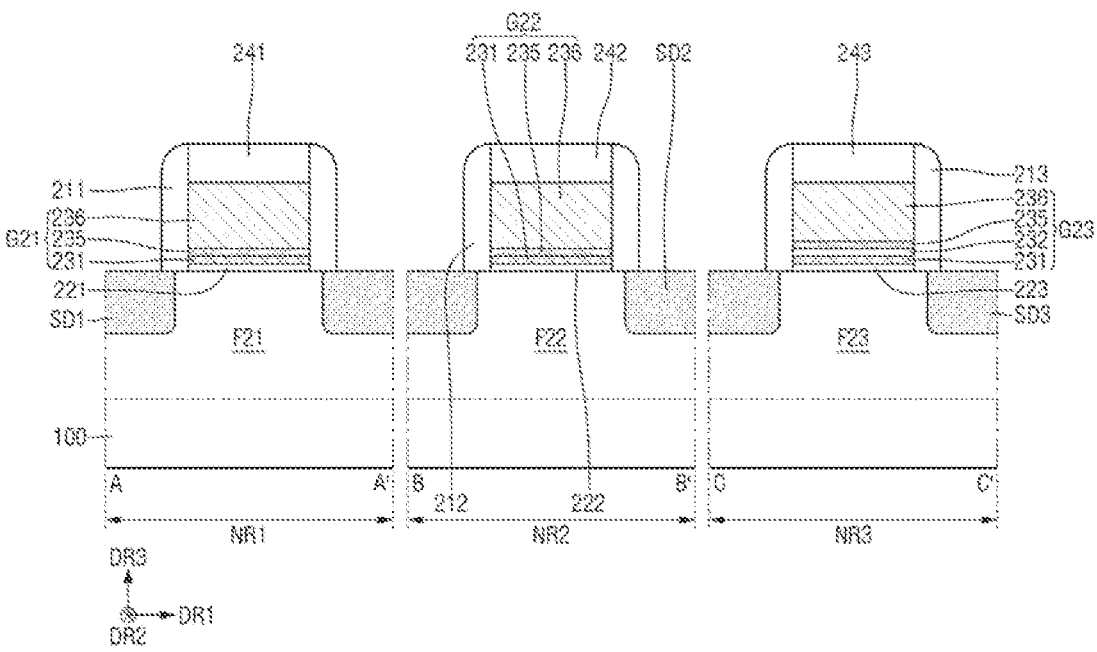
Figure 52:
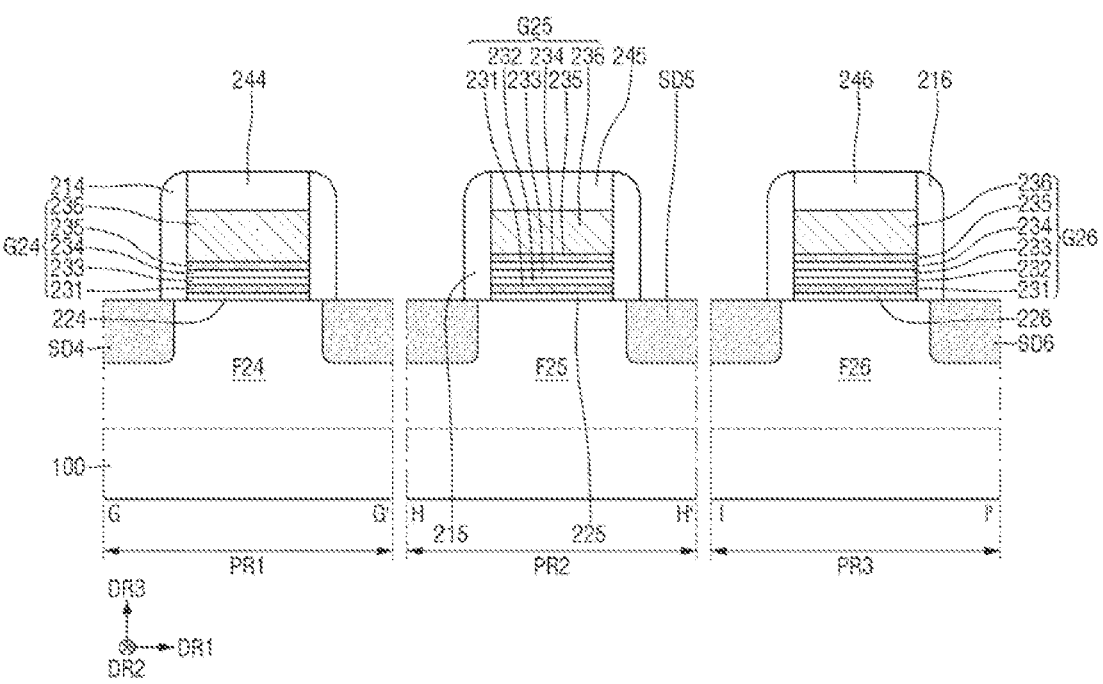

Referring to FIGS. 51 and 52, the first gate spacer 211 may be formed on (e.g., directly thereon) both sidewalls of the first structure in the first horizontal direction DR1. The second gate spacer 212 may be formed on (e.g., directly thereon) both sidewalls of the second structure in the first horizontal direction DR1. The third gate spacer 213 may be formed on (e.g., directly thereon) both sidewalls of the third structure in the first horizontal direction DR1. The fourth gate spacer 214 may be formed on (e.g., directly thereon) both sidewalls of the fourth structure in the first horizontal direction DR1. The fifth gate spacer 215 may be formed on (e.g., directly thereon) both sidewalls of the fifth structure in the first horizontal direction DR1. The sixth gate spacer 216 may be formed on (e.g., directly thereon) both sidewalls of the sixth structure in the first horizontal direction DR1.

In an embodiment, the first source/drain region SD1 may then be formed at both sides of the first gate electrode G21 in the first active pattern F21. The second source/drain region SD2 may be formed at both sides of the second gate electrode G22 in the second active pattern F22. The third source/drain region SD3 may be formed at both sides of the third gate electrode G23 in the third active pattern F23. The fourth source/drain region SD4 may be formed at both sides of the fourth gate electrode G24 in the fourth active pattern F24. The fifth source/drain region SDS may be formed at both sides of the fifth gate electrode G25 in the fifth active pattern F25. The sixth source/drain region SD6 may be formed at both sides of the sixth gate electrode G26 in the sixth active pattern F26.

Referring to FIGS. 41 to 44, the first interlayer insulating layer 150 may be formed on (e.g., directly thereon) the field insulating layer 205 and the first to sixth active patterns F21 to F26. The first interlayer insulating layer 150 may cover each of the first to sixth source/drain regions SD1 to SD6. For example, the top surface of the first interlayer insulating layer 150 may be formed on the same plane (e.g., in the vertical direction DR3) as the top surface of each of the first to sixth capping patterns 241 to 246. In an embodiment, the etch stop layer 160 and the second interlayer insulating layer 170 may then be sequentially formed on the first interlayer insulating layer 150 and the first to sixth capping patterns 241 to 246. Through this process, the semiconductor device shown in FIGS. 41 to 44 may be fabricated.

In concluding the detailed description, those skilled in the art will appreciate that many variations and modifications can be made to the described embodiments without substantially departing from the principles of the present disclosure. Therefore, the described embodiments of the present disclosure are used in a generic and descriptive sense only and not for purposes of limitation.

What is claimed is:

1. A method for fabricating a semiconductor device, comprising:

providing a substrate having first to fourth regions defined thereon;

forming a first active pattern on the substrate in the first region, forming a second active pattern on the substrate in the second region, forming a third active pattern on the substrate in the third region, and forming a fourth active pattern on the substrate in the fourth region, each of the first to fourth active patterns extending in a first horizontal direction;

forming a gate insulating layer on each of the first to fourth active patterns;

forming a first layer on the gate insulating layer in the first to fourth regions;

forming a first passivation layer containing a material having an etching selectivity with respect to the first layer on the first layer in the first to fourth regions, etching the first passivation layer formed in the second and fourth regions;

forming a second layer on each of the first passivation layer in the first and third regions and the first layer in the second and fourth regions;

forming a second passivation layer containing a material having an etching selectivity with respect to the second layer on the second layer in the first to fourth regions;

etching the second passivation layer in the first, third and fourth regions;

etching the second layer and the first passivation layer in the third region;

forming a third layer on each of the second layer in the first and fourth regions, the second passivation layer in the second region, and the first layer in the third region;

etching the third layer in the first and second regions and the second layer in the first region;

forming a fourth layer on each of the first passivation layer in the first region, the second passivation layer in the second region, and the third layer in the third and fourth regions;

etching the fourth layer in the first and second regions;

etching the first passivation layer in the first region and the second passivation layer in the second region; and forming a fifth layer on each of the first layer in the first region, the second layer in the second region, and the fourth layer in the third and fourth regions.

2. The method of claim 1, wherein the first to fourth layers contain a same material as each other.

3. The method of claim 2, wherein each of the first to fourth layers contains titanium nitride (TiN).

4. The method of claim 1, wherein the fifth layer contains a material different from a material of each of the first to fourth layers.

5. The method of claim 4, wherein the fifth layer contains titanium aluminum carbide (TiAlC).

6. The method of claim 1, wherein:

the first region and the second region are NMOS regions; and the third region and the fourth region are PMOS regions.

7. The method of claim 1, wherein the first layer is in direct contact with the gate insulating layer.

8. The method of claim 1, wherein the first passivation layer is in direct contact with the first layer.

9. The method of claim 1, wherein each of the first passivation layer and the second passivation layer contains aluminum oxide ($Al_2O_3$).

10. The method of claim 1, further comprising forming a filling layer on the fifth layer in the first to fourth regions after the fifth layer is formed.

11. The method of claim 1, wherein the forming of the gate insulating layer comprises:

forming a first dummy gate extending in a second horizontal direction that crosses the first horizontal direction on the first active pattern, forming a second dummy gate extending in the second horizontal direction on the second active pattern, forming a third dummy gate extending in the second horizontal direction on the third active pattern, and forming a fourth dummy gate extending in the second horizontal direction on the fourth active pattern;

forming gate spacers on both sidewalls of each of the first to fourth dummy gates in the first horizontal direction;

etching the first to fourth dummy gates, the etching of the first to fourth dummy gates forming first to fourth gate trenches in the first to fourth regions, respectively, and forming the gate insulating layer along a sidewall and a bottom surface of each of the first to fourth gate trenches.

12. The method of claim 1, further comprising, after the fifth layer is formed:

performing a patterning process forming a first gate electrode extending in a second horizontal direction that crosses the first horizontal direction on the first active pattern, a second gate electrode extending in the second horizontal direction on the second active pattern, a third gate electrode extending in the second horizontal direction on the third active pattern, and a fourth gate electrode extending in the second horizontal direction on the fourth active pattern; and forming gate spacers on both sidewalls of each of the first to fourth gate electrodes in the first horizontal direction.

13. A method for fabricating a semiconductor device, comprising:

providing a substrate having first to fourth regions defined thereon, wherein the first and second regions are NMOS regions and the third and fourth regions are PMOS regions;

forming a first active pattern on the substrate in the first region, forming a second active pattern on the substrate in the second region, forming a third active pattern on the substrate in the third region, and forming a fourth active pattern on the substrate in the fourth region, each of the first to fourth active patterns extending in a first horizontal direction;

forming a first dummy gate extending in a second horizontal direction that crosses the first horizontal direction on the first active pattern, forming a second dummy gate extending in the second horizontal direction on the second active pattern, forming a third dummy gate extending in the second horizontal direction on the third active pattern, and forming a fourth dummy gate extending in the second horizontal direction on the fourth active pattern;

forming gate spacers on both sidewalls of each of the first to fourth dummy gates in the first horizontal direction;

etching the first to fourth dummy gates, the etching of the first to fourth dummy gates forming first to fourth gate trenches in the first to fourth regions, respectively;

forming a gate insulating layer along a sidewall and a bottom surface of each of the first to fourth gate trenches;

forming a first layer on the gate insulating layer in the first to fourth regions;

forming a first passivation layer on the first layer in the first to fourth regions, the first passivation layer containing a material having an etching selectivity with respect to the first layer, the first passivation layer is in direct contact with the first layer;

etching the first passivation layer formed in the second and fourth regions;

forming a second layer on each of the first passivation layer in the first and third regions and the first layer in the second and fourth regions;

forming a second passivation layer containing a material having an etching selectivity with respect to the second layer on the second layer in the first to fourth regions;

etching the second passivation layer in the first, third and fourth regions;

etching the second layer and the first passivation layer in the third region;

forming a third layer on each of the second layer in the first and fourth regions, the second passivation layer in the second region, and the first layer in the third region;

etching the third layer in the first and second regions and the second layer in the first region;

forming a fourth layer on each of the first passivation layer in the first region, the second passivation layer in the second region, and the third layer in the third and fourth regions;

etching the fourth layer in the first and second regions; and etching the first passivation layer of the first region and the second passivation layer of the second region, wherein the first to fourth layers contain a same material as each other.

14. The method of claim 13, further comprising, after the second passivation layer is etched, forming a fifth layer on each of the first layer in the first region, the second layer in the second region, and the fourth layer in the third and fourth regions; and forming a filling layer on the fifth layer in the first to fourth regions.

15. The method of claim 14, wherein the fifth layer contains a material different from a material of each of the first to fourth layers.

16. The method of claim 15, wherein the fifth layer contains titanium aluminum carbide (TiAlC).

17. The method of claim 13, wherein each of the first to fourth layers contains titanium nitride (TiN).

18. The method of claim 13, wherein each of the first passivation layer and the second passivation layer contains aluminum oxide ($Al_2O_3$).

19. A method for fabricating a semiconductor device, comprising:

providing a substrate having first to sixth regions defined thereon, wherein the first to third regions are NMOS regions and the fourth to sixth regions are PMOS regions;

forming a first active pattern on the substrate in the first region, forming a second active pattern on the substrate in the second region, forming a third active pattern on the substrate in the third region, forming a fourth active pattern on the substrate in the fourth region, forming a fifth active pattern on the substrate in the fifth region, and forming a sixth active pattern on the substrate in the sixth region, each of the first to sixth active patterns extending in a first horizontal direction;

forming a gate insulating layer on each of the first to sixth active patterns;

forming a first layer containing titanium nitride (TiN) on the gate insulating layer in the first to sixth regions;

forming a first passivation layer containing a material having an etching selectivity with respect to the first layer on the first layer in the first to sixth regions;

etching the first passivation layer formed in the third region, the fifth region, and the sixth region;

forming a second layer on each of the first passivation layer in the first, second and fourth regions and the first layer in the third, fifth and sixth regions;

forming a second passivation layer containing a material having an etching selectivity with respect to the second layer on the second layer in the first to sixth regions;

etching the second passivation layer in the first, second, and fourth to sixth regions;

etching the second layer and the first passivation layer in the fourth region;

forming a third layer on each of the second layer in the first, second, fifth and sixth regions, the second passivation layer in the third region, and the first layer in the fourth region;

etching the third layer of the first to third regions and the second layer of the first and second regions;

forming a fourth layer on each of the first passivation layer in the first and second regions, the second passivation layer in the third region, and the third layer in the fourth to sixth regions;

etching the fourth layer in the first to third regions;

etching the first passivation layer in the first and second regions and the second passivation layer in the third region;

forming a fifth layer on each of the first layer in the first and second regions, the second layer in the third region, and the fourth layer in the fourth to sixth regions; and forming a filling layer on the fifth layer in the first to sixth regions.

20. The method of claim 19, wherein:

each of the first to fourth layers contains titanium nitride (TiN);

the fifth layer contains titanium aluminum carbide (TiAlC); and each of the first passivation layer and the second passivation layer contains aluminum oxide ($Al_2O_3$).

* * * * *